(12) United States Patent
Mimura et al.

(10) Patent No.: US 8,278,022 B2
(45) Date of Patent: Oct. 2, 2012

(54) POSITIVE RESIST COMPOSITION AND METHOD OF FORMING RESIST PATTERN

(75) Inventors: Takeyoshi Mimura, Kawasaki (JP); Makiko Irie, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 353 days.

(21) Appl. No.: 12/487,083

(22) Filed: Jun. 18, 2009

(65) Prior Publication Data

US 2009/0317745 A1    Dec. 24, 2009

(30) Foreign Application Priority Data

Jun. 20, 2008  (JP) ................ 2008-161634
Sep. 26, 2008  (JP) ................ 2008-247802

(51) Int. Cl.
*G03C 1/00*   (2006.01)
*G03F 7/00*   (2006.01)

(52) U.S. Cl. .................. 430/270.1; 430/325
(58) Field of Classification Search .............. 430/270.1, 430/325
See application file for complete search history.

(56) References Cited

U.S. PATENT DOCUMENTS

| | | | |
|---|---|---|---|
| 5,945,517 A | 8/1999 | Nitta et al. | |
| 6,153,733 A | 11/2000 | Yukawa et al. | |
| 2008/0020289 A1 | 1/2008 | Hatakeyama et al. | |
| 2008/0113294 A1 | 5/2008 | Echigo et al. | |
| 2009/0202939 A1 | 8/2009 | Shiono et al. | |
| 2011/0172457 A1 | 7/2011 | Yoshitomo et al. | |

FOREIGN PATENT DOCUMENTS

| | | |
|---|---|---|
| JP | H09-208554 | 8/1997 |
| JP | H11-035551 | 2/1999 |
| JP | H11-035552 | 2/1999 |
| JP | H11-035573 | 2/1999 |
| JP | H11-322707 | 11/1999 |
| JP | A-2007-041501 | 2/2007 |
| JP | A-2007-197389 | 8/2007 |
| JP | A-2007-206371 | 8/2007 |
| JP | A-2008-001604 | 1/2008 |
| JP | A-2008-050568 | 3/2008 |
| WO | WO 2004-074242 | 9/2004 |
| WO | WO 2007/034719 A1 | 3/2007 |
| WO | WO2009/154291 | 12/2009 |

OTHER PUBLICATIONS

Hirayama et al., Journal of Photopolymer Science and Technology, vol. 17 (2004), No. 3, p. 435-440.
Kim et al., Chemistry Letters (2002), p. 1064-1065.
Office Action issued in Japanese Patent Application No. 2008-247802 on Jun. 26, 2012.
Fukuzaki et al., "Synthesis of Dendritic, Non-Kekule and Nondisjoint-Type Triphenylmethanes Terminated with Galvinoxyl Radicals," Polymer Journal, vol. 37, No. 4, pp. 284-293, Apr. 15, 2005.

*Primary Examiner* — Cynthia Kelly
*Assistant Examiner* — Connie P Johnson
(74) *Attorney, Agent, or Firm* — Knobbe Martens Olson & Bear LLP

(57) ABSTRACT

Provided are a novel positive resist composition that includes a low molecular weight material as a base material component, and a method of forming a resist pattern using the positive resist composition.
A positive resist composition including: a base material component (A) that exhibits increased solubility in an alkali developing solution under the action of acid; and an acid generator component (B) that generates acid upon exposure, wherein the base material component (A) comprises a compound (A1) in which either a portion of, or all of, the hydrogen atoms of hydroxyl groups (—OH) within a phenolic compound (I) described below have been substituted with a group containing an acid dissociable, dissolution inhibiting group:
the phenolic compound (I) including 4 triphenylmethane structures, and a tetravalent linking moiety that links the 4 triphenylmethane structures, wherein at least one of the 4 triphenylmethane structures has at least one phenolic hydroxyl group.

5 Claims, No Drawings

POSITIVE RESIST COMPOSITION AND METHOD OF FORMING RESIST PATTERN

BACKGROUND OF THE INVENTION

1. Field of the Invention

The present invention relates to a novel positive resist composition, and a method of forming a resist pattern using the same.

The application claims priority from Japanese Patent Application No. 2008-161634 filed on Jun. 20, 2008, and Japanese Patent Application No. 2008-247802 filed on Sep. 26, 2008, the disclosures of which are incorporated by reference herein.

2. Description of the Related Art

In recent years, in the production of semiconductor elements and liquid crystal display elements, advances in lithography techniques have led to rapid progress in the field of pattern miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are now starting to be introduced in mass production of semiconductor elements. Furthermore, research is also being conducted into lithography techniques that use exposure light source having a wavelength shorter than these excimer lasers, such as $F_2$ excimer lasers, electron beam, extreme ultraviolet radiation (EUV), and X ray.

As shortening of the wavelength of the exposure light source progresses, it is required to improve various lithography properties of the resist material, such as the sensitivity to the exposure light source and a resolution capable of reproducing patterns of minute dimensions. As a resist material which satisfies these conditions, a chemically amplified resist is known, which includes a base material component that exhibits a changed solubility in an alkali developing solution under action of acid and an acid generator component that generates acid upon exposure. These chemically amplified resists include negative resists in which the alkali solubility decreases upon exposure, and positive resists in which the alkali solubility increases upon exposure.

Conventionally, polymers have been used as the base material components within these types of chemically amplified resists, and examples of these polymers include polyhydroxystyrene (PHS), PHS-based resins in which a portion of the hydroxyl groups of a PHS have been protected with acid dissociable, dissolution inhibiting groups, copolymers derived from (meth)acrylate esters, and resins in which a portion of the carboxyl groups within these (meth)acrylate esters have been protected with acid dissociable, dissolution inhibiting groups.

However, when a pattern is formed using these types of pattern-forming materials, a problem arises in that roughness can develop on the upper surface and side wall surfaces of the pattern. For example, roughness on the side wall surfaces of a resist pattern, so-called line edge roughness (LER), can cause distortions around the holes in hole patterns, and fluctuations in the line width in line and space patterns, and consequently has the potential to adversely affect the formation of very fine semiconductor elements.

This problem becomes more significant as the pattern dimensions are reduced. Accordingly, in lithography processes using electron beams or EUV or the like, which are targeting the formation of very fine patterns with dimensions of several dozen nm, very low levels of roughness that are superior to current levels of pattern roughness are being demanded.

However, the polymers typically used as base material components have a large molecular size (or root mean squared radius per molecule) of several nm. In the developing step of a pattern formation process, the solubility behavior of the resist with respect to the developing solution typically occurs in single molecule units of the base material component, meaning that as long as polymers are used as the base material component, further reductions in the level of roughness will remain extremely difficult to achieve.

In order to overcome this type of problem, resists that employ a low molecular weight material as the base material component have been proposed as potential materials for achieving ultra low levels of roughness. For example, Non-Patent Documents 1 and 2 propose low molecular weight materials having alkali-soluble groups such as hydroxyl groups or carboxyl groups, in which some or all of these groups have been protected with acid dissociable, dissolution inhibiting groups.

[Non-Patent Document 1] T. Hirayama, D. Shiono, H. Hada and J. Onodera: J. Photopolym. Sci. Technol., 17 (2004), p. 435

[Non-Patent Document 2] Jim-Baek Kim, Hyo-Jin Yun, Young-Gil Kwon: Chemistry Letters (2002), pp. 1064 to 1065.

SUMMARY OF THE INVENTION

These types of low molecular weight materials described above have small molecular sizes in keeping with their lower molecular weights, and as such, are expected to enable reductions in the level of roughness. Accordingly, there are now growing demands for novel low molecular weight materials that can be used for resist compositions, for example, a low molecular weight material that is capable of forming resist patterns at a level that enables their practical application when blended into a resist composition as a base material component.

The present invention takes the above circumstances into consideration, with an object of providing a novel positive resist composition that includes a low molecular weight material as a base material component, and a method of forming a resist pattern using the positive resist composition.

In order to achieve the above object, the present invention employs the following aspects.

Specifically, a first aspect of the present invention is a positive resist composition that includes a base material component (A) that exhibits increased solubility in an alkali developing solution under action of an acid, and an acid generator component (B) that generates an acid upon exposure, the base material component (A) includes a compound (A1) in which either a portion of, or all of, the hydrogen atoms of hydroxyl groups (—OH) within a phenolic compound (I) described below have been substituted with a group containing an acid dissociable, dissolution inhibiting group.

Phenolic compound (I): a phenolic compound including 4 triphenylmethane structures and a tetravalent linking moiety that links the 4 triphenylmethane structures, wherein at least one of the 4 triphenylmethane structures has at least one phenolic hydroxyl group.

A second aspect of the present invention is a method of forming a resist pattern, including: applying a positive resist composition of the first aspect to a substrate to form a resist film on the substrate; exposing the resist film; and developing the resist film to form a resist pattern.

In the present description and claims, an "alkyl group" includes linear, branched or cyclic, monovalent saturated hydrocarbon groups, unless otherwise specified.

A "lower alkyl group" is an alkyl group of 1 to 5 carbon atoms.

An "alkylene group" includes linear, branched or cyclic, divalent saturated hydrocarbon groups, unless otherwise specified.

The term "aliphatic" is a relative concept used in relation to the term "aromatic", and defines a group or compound that has no aromaticity. The term "aliphatic cyclic group" refers to a monocyclic group or polycyclic group that has no aromaticity.

The term "exposure" is used as a general concept that includes irradiation with any form of radiation.

According to the present invention, there are provided a novel positive resist composition that includes a low molecular weight material as a base material component, and a method of forming a resist pattern using the positive resist composition.

DETAILED DESCRIPTION OF THE INVENTION

<<Positive Resist Composition>>

The positive resist composition of the present invention includes a base material component (A) (hereafter, frequently referred to as "component (A)") which exhibits increased solubility in an alkali developing solution under the action of acid and an acid generator component (B) (hereafter, frequently referred to as "component (B)") which generates acid upon exposure. The term "base material component" refers to an organic compound with a film forming capability.

In the positive resist composition, when acid is generated from the component (B) upon exposure, the action of that acid causes an increase in the solubility of the component (A) in an alkali developing solution. Therefore, in the formation of a resist pattern, by either conducting selective exposure of a resist film formed from the positive resist composition or by conducting exposure of a resist film followed by post exposure baking, the solubility of the exposed portions of the resist in an alkali developing solution is increased, whereas the solubility of the unexposed portions in an alkali developing solution remains unchanged, and hence, a positive resist pattern can be formed by alkali developing of the resist film.

<Component (A)>

The compound (A1) is a compound in which either a portion of, or all of, the hydrogen atoms of (—OH) groups within a phenolic compound (I) described below, have been substituted with a group containing an acid dissociable, dissolution inhibiting group.

Phenolic compound (I): a phenolic compound including 4 triphenylmethane structures and a linking moiety that links the 4 triphenylmethane structures, wherein at least one of the 4 triphenylmethane structures has at least one phenolic hydroxyl group.

In the present descriptions and the claims, the term "triphenylmethane structure" refers to a structure in which three benzene rings that may have a substituent are bonded via one carbon atom.

The term "phenolic hydroxyl group" refers to a hydroxyl group that is directly bonded to an aromatic ring such as a benzene ring and a naphthalene ring.

An acid dissociable, dissolution inhibiting group within the "group containing an acid dissociable, dissolution inhibiting group" is a group having an alkali dissolution inhibiting effect that renders the compound (A1) insoluble in an alkali developing solution prior to dissociation, and then following dissociation under the action of the acid generated from the component (B) upon exposure, increases the solubility of the compound (A1) in the alkali developing solution. Therefore, in the positive resist composition in which the compound (A1) is blended together with the acid generator component (B), when an acid is generated from the component (B) upon exposure, the action of that acid causes the acid dissociable, dissolution inhibiting group to dissociate, thereby causing the compound (A1) to shift from being substantially insoluble in an alkali developing solution to being alkali-soluble and eventually increasing the solubility of the positive resist composition in an alkali developing solution.

The group containing an acid dissociable, dissolution inhibiting group is a group that contains an acid dissociable, dissolution inhibiting group, and may be a group composed solely of the acid dissociable, dissolution inhibiting group or may be a group composed of the acid dissociable, dissolution inhibiting group as well as a group or atom other than the acid dissociable, dissolution inhibiting group.

In the compound (A1), the "(—OH) groups within a phenolic compound (I)", in which hydrogen atoms have been substituted with a group containing an acid dissociable, dissolution inhibiting group, include the phenolic hydroxyl groups (—OH) within the phenolic compound (I) and the (—OH) groups within carboxyl groups (—CO—OH) (hereafter, frequently referred to as "carboxyl hydroxyl group").

[Phenolic Compound (I)]

The phenolic compound (I) includes at least one triphenylmethane structure containing at least one phenolic hydroxyl group (hereafter, frequently referred to as "(—OH) group-containing triphenylmethane structure").

The number of phenolic hydroxyl groups in each (—OH) group-containing triphenylmethane structure is preferably 1 to 5, and more preferably 2 to 3.

It is preferable that the (—OH) group-containing triphenylmethane structure be a triphenylmethane structure that further contains at least one carboxyl group.

The number of carboxyl groups in each (—OH) group-containing triphenylmethane structure is preferably 1 to 4, more preferably 1 or 2, and most preferably 1.

Further, it is preferable that one of the three benzene rings that constitute one (—OH) group-containing triphenylmethane structure has a carboxyl group while the other two benzene rings do not have a carboxyl group.

Moreover, among the 4 triphenylmethane structures included within the phenolic compound (I), it is preferable that 2 or more triphenylmethane structures be (—OH) group-containing triphenylmethane structures, more preferably 3 or more triphenylmethane structures, and it is most preferable that all the 4 triphenylmethane structures be (—OH) group-containing triphenylmethane structures.

The combined total of all phenolic hydroxyl groups in the phenolic compound (I) is preferably within a range from 1 to 20, more preferably from 2 to 12, and still more preferably from 4 to 10.

Further, the combined total of all carboxyl groups in the phenolic compound (I) is preferably within a range from 1 to 16, more preferably from 1 to 8, still more preferably from 2 to 6, and most preferably 4. In other words, it is most preferable that the phenolic compound (I) be a tetracarboxylic acid having 4 carboxyl groups.

In the (—OH) group-containing triphenylmethane structure, the phenolic hydroxyl groups and carboxyl groups may be bonded directly to the benzene rings that constitute the (—OH) group-containing triphenylmethane structure or may be bonded via a linking group.

Among these groups, it is preferable that the phenolic hydroxyl groups be bonded directly to the benzene rings that constitute the (—OH) group-containing triphenylmethane structure.

Further, it is preferable that the carboxyl groups be bonded to the benzene rings that constitute the (—OH) group-containing triphenylmethane structure via a linking group.

Examples of the linking group that links the benzene rings and the carboxyl groups in the (—OH) group-containing triphenylmethane structure include a group containing a hetero atom (hereafter, frequently referred to as "hetero atom-containing linking group") and a divalent hydrocarbon group that may have a substituent.

With respect to the hetero atom-containing linking group, the "hetero atom" is an atom other than a carbon atom and a hydrogen atom, and examples thereof include an oxygen atom, a sulfur atom and a nitrogen atom.

As the hetero atom-containing linking group, for example, non-hydrocarbon based groups such as an oxygen atom (an ether bond; —O—), a sulfur atom (a thioether bond; —S—), an —NH— group (the H may be substituted with a substituent such as an alkyl group or an acyl group), a carbonyloxy group (—COO—), a carbonyl group (—CO—), an amide bond (—CONH—) and a carbonate group (—OCOO—); and combinations of the aforementioned non-hydrocarbon based groups and the divalent hydrocarbon groups described later, can be mentioned.

The divalent hydrocarbon group may be either an aliphatic hydrocarbon group or an aromatic hydrocarbon group.

The aliphatic hydrocarbon group as the above divalent hydrocarbon group may be either saturated or unsaturated, but in general, the aliphatic hydrocarbon group is preferably saturated.

More specific examples of the aliphatic hydrocarbon group include linear or branched aliphatic hydrocarbon groups, and aliphatic hydrocarbon groups that contain a ring within their structures.

In the linear or branched aliphatic hydrocarbon group, the number of carbon atoms is preferably within a range from 1 to 10, more preferably from 1 to 8, even more preferably from 1 to 6, particularly preferably from 1 to 5, and is most preferably 1 or 2.

As the linear aliphatic hydrocarbon group, linear alkylene groups are preferred, and specific examples include a methylene group [—CH$_2$—], an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, branched alkylene groups are preferred, and specific examples include various alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$— and —C(CH$_2$CH$_3$)$_2$CH$_2$—; alkyltrimethylene groups CH(CH$_3$)CH$_2$CH$_2$— and —CH$_2$CH(CH$_3$)CH$_2$—; and alkyltetramethylene groups such as —CH(CH$_3$)CH$_2$CH$_2$CH$_2$— and —CH$_2$CH(CH$_3$)CH$_2$CH$_2$—. The alkyl groups within these alkylalkylene groups are preferably linear alkyl groups of 1 to 5 carbon atoms.

The linear or branched aliphatic hydrocarbon groups may or may not have a substituent. The hydrocarbon group "has a substituent" means that some or all of the hydrogen atoms of the hydrocarbon group are substituted with atoms or groups other than a hydrogen atom.

Examples of the substituent include a hydroxyl group, a carboxyl group, a fluorine atom, a fluorinated lower alkyl group of 1 to 5 carbon atoms which is substituted by a fluorine atom, and an oxygen atom (=O).

Examples of the aliphatic hydrocarbon groups that contain a ring include cyclic aliphatic hydrocarbon groups (groups in which two hydrogen atoms have been removed from an aliphatic hydrocarbon ring), and groups in which this type of cyclic aliphatic hydrocarbon group is either bonded to the terminal of an abovementioned linear or branched aliphatic hydrocarbon group or positioned partway along the linear or branched aliphatic hydrocarbon group.

The cyclic aliphatic hydrocarbon group preferably has 3 to 20 carbon atoms, and more preferably 3 to 12 carbon atoms.

The cyclic aliphatic hydrocarbon group may be either a polycyclic group or a monocyclic group. As the monocyclic group, a group in which two hydrogen atoms have been removed from a monocycloalkane of 3 to 6 carbon atoms is preferable. Examples of the monocycloalkane include cyclopentane and cyclohexane.

As the polycyclic group, a group in which two hydrogen atoms have been removed from a polycycloalkane of 7 to 12 carbon atoms is preferable. Specific examples of the polycycloalkane include adamantane, norbornane, isobornane, tricyclodecane and tetracyclododecane.

The cyclic aliphatic hydrocarbon groups may or may not have a substituent. Examples of substituents include a lower alkyl group of 1 to 5 carbon atoms, a fluorine atom, a fluorinated lower alkyl group of 1 to 5 carbon atoms which is substituted by a fluorine atom, and an oxygen atom (=O).

Examples of the aromatic hydrocarbon groups as the above divalent hydrocarbon groups include a group in which two hydrogen atoms have been removed from a hydrocarbon that contains an aromatic hydrocarbon ring within the structure. Specific examples thereof include a group in which two hydrogen atoms have been removed from an aromatic hydrocarbon ring (namely, an arylene group), and a group in which this type of arylene group is either bonded to the terminal of an above-mentioned chain-like (linear or branched) aliphatic hydrocarbon group or positioned partway along the chain-like (linear or branched) aliphatic hydrocarbon group.

Examples of the aromatic hydrocarbon ring include a benzene ring, a biphenyl ring, a fluorene ring, a naphthalene ring, an anthracene ring, a phenanthrene ring, and a pyrene ring.

A part of the carbon atoms constituting the aromatic hydrocarbon group may be substituted with a hetero atom such as an oxygen atom, a sulfur atom or a nitrogen atom.

The aromatic hydrocarbon group may or may not have a substituent. The aromatic hydrocarbon ring "has a substituent" means that some or all of the hydrogen atoms of an unsubstituted aromatic hydrocarbon ring are substituted with substituents (namely, atoms or groups other than a hydrogen atom).

The substituents which an aromatic hydrocarbon group may include are preferably at least one substituent selected from the group consisting of a hydroxyl group, a halogen atom, an alkyl group, an aryl group, an alkoxy group, and an aryloxy group.

Examples of the halogen atom as the above substituent include a fluorine atom, a chlorine atom, a bromine atom and an iodine atom.

The alkyl group as the above substituent is not particularly limited and may be any of linear, branched or cyclic.

The linear alkyl group is preferably an alkyl group of 1 to 5 carbon atoms, and specific examples include a methyl group, an ethyl group, an n-propyl group, an n-butyl group, and an n-pentyl group, and a methyl group or an ethyl group is particularly desirable.

The branched alkyl group preferably has 4 to 10 carbon atoms, and more preferably 4 to 8 carbon atoms. Specific examples thereof include an isobutyl group, a tert-butyl group, an isopentyl group, a neopentyl group, and a tert-pentyl group.

The cyclic alkyl group preferably has 3 to 20 carbon atoms, more preferably 4 to 14 carbon atoms, and most preferably 5 to 12 carbon atoms.

The basic ring structure within the cyclic alkyl group (namely, the basic ring exclusive of substituents) may be either monocyclic or polycyclic. Further, the basic ring may be either a hydrocarbon ring formed solely from carbon and hydrogen, or a heterocycle as described later in which a portion of the carbon atoms that constitute a hydrocarbon ring have been substituted with hetero atoms. Examples of the hydrocarbon ring include a monocycloalkane, a bicycloalkane, a tricycloalkane and a tetracycloalkane. Specific examples thereof include a monocycloalkane such as cyclopentane and cyclohexane, and a polycycloalkane such as adamantane, norbornane, isobornane, tricyclodecane and tetracyclododecane.

These basic ring structures may include a substituent formed of a hydrocarbon group on the ring, or may have no substituents. Examples of the hydrocarbon group include linear or branched alkyl groups of 1 to 5 carbon atoms such as a methyl group and an ethyl group. In those cases where the basic ring structure includes a substituent, the number of substituents is preferably within a range from 1 to 3, and is more preferably 1.

There are no particular limitations on the aryl groups as the aforementioned substituent, although aryl groups having 6 to 15 carbon atoms are preferred. Examples thereof include a phenyl group, a tolyl group, a xylyl group, a mesityl group, a phenethyl group, and a naphthyl group. Of these, a phenyl group is preferable.

Examples of the alkoxy group as the above substituent include groups in which the aforementioned alkyl group is bonded to an oxygen atom (—O—).

Examples of the aryloxy group as the above substituent include groups in which the aforementioned aryl group is bonded to an oxygen atom (—O—).

The alkyl group, aryl group, alkoxy group, and aryloxy group as the above substituent may include a group or atom other than a hydrocarbon group within the group structure.

For example, either a portion of, or all of, the hydrogen atoms within the alkyl group, aryl group, alkoxy group and aryloxy group may be substituted with a group that contains a hetero atom (including those cases where the hetero atom itself functions as the substituent group), and a portion of the carbon atoms of the alkyl group, aryl group, alkoxy group and aryloxy group may be substituted with a hetero atom (including those cases where the hetero atom itself functions as the substituent group).

Examples of suitable hetero atoms substituting hydrogen atoms within the "group that contains a hetero atom" include an oxygen atom, a sulfur atom, a nitrogen atom, and a fluorine atom.

Examples of the group in which either a portion of, or all of, the hydrogen atoms have been substituted with a group that contains a hetero atom include a group in which a portion of, or all of, the hydrogen atoms have been substituted with a group consisting of the hetero atom and a carbon atom and/or hydrogen atom, such as a hydroxyl group, an alkoxy group, and fluorinated lower alkyl group of 1 to 5 carbon atoms in which either a portion of, or all of, the hydrogen atoms have been substituted with fluorine atoms.

Examples of the group in which either a portion of, or all of, the hydrogen atoms have been substituted with a hetero atom itself include a group in which two hydrogen atoms bonded to the same carbon atom have been substituted with a single oxygen atom (namely, a group containing a carbonyl group (C=O)), and a group in which two hydrogen atoms bonded to the same carbon atom have been substituted with a single sulfur atom (namely, a group containing a thiocarbonyl group (C=S)).

Examples of the group in which a portion of the carbon atoms have been substituted with a group that contains a hetero atom include a group containing a —CH$_2$— group within the structure, wherein the —CH$_2$— group has been substituted with a linking group containing the hetero atom (such as a —NH— group and a —O— group).

The substituents for groups other than the hydrocarbon groups may also be those other than the above-described groups that contain a hetero atom.

In the (—OH) group-containing triphenylmethane structure, it is preferable that the carboxyl group be bonded to the benzene rings that constitute the (—OH) group-containing triphenylmethane structure via a group represented by formula —O—R$^{113}$— (wherein R$^{113}$ is a divalent hydrocarbon group that may have a substituent) which serves as a linking group. In other words, in the (—OH) group-containing triphenylmethane structure, it is preferable that a group represented by general formula (z1) shown below be bonded to the benzene rings within the (—OH) group-containing triphenylmethane structure via an oxygen atom (—O—).

[Chemical Formula 1]

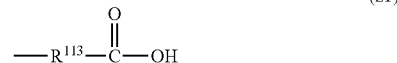

(z1)

wherein R$^{113}$ represents a divalent hydrocarbon group that may have a substituent.

As R$^{113}$, the same groups as those described as divalent hydrocarbon groups for the linking groups described above can be used.

As R$^{113}$, a linear alkylene group or an aromatic hydrocarbon group which may have a substituent is preferred. The aromatic hydrocarbon group preferably includes a benzene ring or a naphthalene ring, and a benzene ring is particularly desirable.

As R$^{113}$, a group represented by general formula (z-1) or (z-2) shown below is particularly desirable.

[Chemical Formula 2]

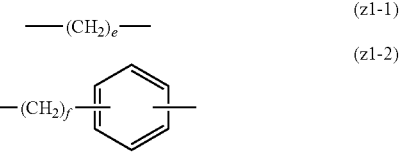

(z1-1)

(z1-2)

wherein e represents an integer of 1 to 5, and f represents an integer of 0 to 5.

In formula (z1-1), e preferably represents an integer of 1 to 3, more preferably 1 or 2, and most preferably 1.

In formula (z1-2), f preferably represents an integer of 0 to 3, more preferably 1 or 2, and most preferably 1.

The benzene ring in formula (z1-2) may have a substituent. As the substituent, the same groups as those which the aforementioned aromatic hydrocarbon group may have as a substituent can be used.

The number of substituents within the benzene ring is preferably 0 to 4, more preferably 0 or 1, and most preferably 0. When the number of substituents is 2 or more, these plurality of substituents may be the same or different. The bonding positions of the substituents on the benzene ring are not particularly limited.

In formula (z1), when $R^{113}$ is a group represented by formula (z1-2), there are no particular limitations on the bonding positions of —$(CH_2)_f$— and —COOH groups on the benzene ring, although it is preferable that the —$(CH_2)_f$— and —COOH groups be bonded so as to be in the para position to each other.

There are no particular limitations on the tetravalent linking moiety that links the 4 triphenylmethane structures described above. Preferred examples of the linking moiety include a tetravalent hydrocarbon group which may have a substituent.

Examples of the hydrocarbon group include a group in which two hydrogen atoms have been removed from the "divalent hydrocarbon group that may have a substituent" described above as the linking group that links the benzene rings and the carboxyl groups in the (—OH) group-containing triphenylmethane structure. When the hydrocarbon group contains a hydroxyl group or a carboxyl group as the substituent, the hydrogen atom of an —OH moiety thereof may be substituted with a group containing an acid dissociable, dissolution inhibiting group. The group containing an acid dissociable, dissolution inhibiting group will be described later in more detail.

As the tetravalent hydrocarbon group, a linear or branched aliphatic hydrocarbon group, an aliphatic hydrocarbon group that contains a ring within its structure, or an aromatic hydrocarbon group is particularly desirable. Specific examples of the hydrocarbon group include groups in which two hydrogen atoms have been removed from the "linear or branched aliphatic hydrocarbon groups", "aliphatic hydrocarbon groups that contain a ring" or "aromatic hydrocarbon groups" described above as the linking groups that link the benzene rings and the carboxyl groups in the (—OH) group-containing triphenylmethane structure.

Of these, aliphatic hydrocarbon groups that contain a ring within their structures are preferable, and groups in which cyclic aliphatic hydrocarbon groups are bonded to the terminals of linear or branched aliphatic hydrocarbon groups are more preferable. In such groups, the cyclic aliphatic hydrocarbon groups may be bonded to either one of the two terminals of the linear or branched aliphatic hydrocarbon groups or may be bonded to both terminals. However, it is preferable that the cyclic aliphatic hydrocarbon groups be bonded to both terminals.

As the tetravalent hydrocarbon group, a group represented by general formula (a-1) shown below is preferable, and a group represented by general formula (a-11) shown below is particularly desirable.

[Chemical Formula 3]

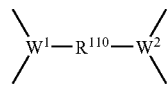

(a-1)

wherein each of $W^1$ and $W^2$ independently represents a cyclic aliphatic hydrocarbon group, and $R^{110}$ represents a linear or branched alkylene group.

The cyclic aliphatic hydrocarbon group for $W^1$ and $W^2$ may be either a polycyclic group or a monocyclic group. As the monocyclic group, a group in which three hydrogen atoms have been removed from a monocycloalkane of 3 to 6 carbon atoms is preferable. Examples of the monocycloalkane include cyclopentane and cyclohexane. As the polycyclic group, a group in which two hydrogen atoms have been removed from a polycycloalkane of 7 to 12 carbon atoms is preferable. Specific examples of the polycycloalkane include adamantane, norbornane, isobornane, tricyclodecane and tetracyclododecane. Of these monocyclic and polycyclic groups, a group in which three hydrogen atoms have been removed from cyclohexane is preferable.

The cyclic aliphatic hydrocarbon groups may or may not have a substituent.

Examples of the substituent include a lower alkyl group of 1 to 5 carbon atoms, a hydroxyl group, a carboxyl group, a fluorine atom, a fluorinated lower alkyl group of 1 to 5 carbon atoms which is substituted by a fluorine atom, and an oxygen atom (=O).

As the linear or branched alkylene group for $R^{110}$, the same linear or branched aliphatic hydrocarbon groups as those described above for the divalent hydrocarbon groups can be given.

[Chemical Formula 4]

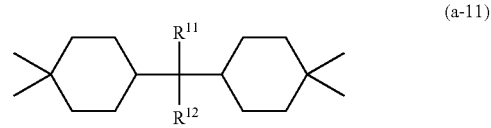

(a-11)

wherein each of $R^{11}$ and $R^{12}$ independently represents an alkyl group of 1 to 5 carbon atoms.

The alkyl group for $R^{11}$ and $R^{12}$ is preferably a linear or branched alkyl group, and more preferably a linear alkyl group.

The alkyl group is preferably an alkyl group of 1 to 3 carbon atoms, and a methyl group is particularly desirable.

As the phenolic compound (I), a phenolic compound (I-1) represented by general formula (I-1) shown below or a substituted phenolic compound (I'-1) in which a portion of the hydrogen atoms of (—OH) groups within the phenolic compound (I-1) have been substituted with alkyl groups of 1 to 10 carbon atoms is preferable.

[Chemical Formula 5]

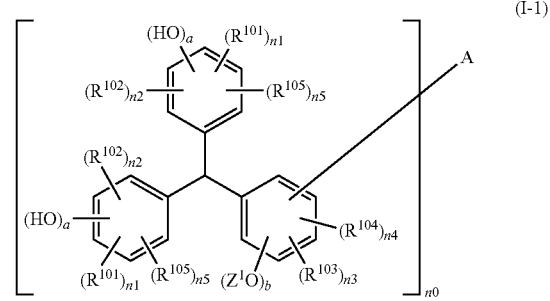

(I-1)

wherein each of $R^{101}$ to $R^{105}$ independently represents an alkyl group of 1 to 10 carbon atoms or an aromatic hydrocarbon group which may include a heteroatom within a structure thereof; $Z^1$ is a group represented by general formula (z1) shown below or a hydrogen atom; each of a and n1 independently represents an integer of 1 or more and each of n2 and n5 independently represents an integer of 0 or more, with the proviso that a+n1+n2+n5 is not greater than 5; b represents an integer of 1 or more and each of n3 and n4 independently represents an integer of 0 or more, with the proviso that b+n3+n4 is not greater than 4; n0 is 4; and A represents a tetravalent linking moiety.

[Chemical Formula 6]

(z1)

wherein $R^{113}$ represents a divalent hydrocarbon group that may have a substituent.

The phenolic compound (I-1) represented by general formula (I-1) above includes a structure in which 4 specific triphenylmethane structures are bonded to A.

In formula (I-1), the alkyl group for $R^{101}$ to $R^{105}$ is preferably a linear or branched lower alkyl group of 1 to 5 carbon atoms or a cyclic alkyl group of 5 to 6 carbon atoms.

Examples of the lower alkyl group include linear or branched alkyl groups such as a methyl group, an ethyl group, a propyl group, an isopropyl group, an n-butyl group, an isobutyl group, a tert-butyl group, a pentyl group, an isopentyl group, and a neopentyl group. Of these, a methyl group is preferable. Examples of the cyclic alkyl group include a cyclohexyl group and a cyclopentyl group, and a cyclohexyl group is preferable.

The aromatic hydrocarbon groups preferably have 6 to 15 carbon atoms, and examples thereof include a phenyl group, a tolyl group, a xylyl group, a mesityl group, a phenethyl group, and a naphthyl group.

These alkyl groups or aromatic hydrocarbon groups may include a hetero atom such as an oxygen atom, a nitrogen atom and a sulfur atom within the structures thereof.

$Z^1$ is preferably a group represented by formula (z1).

In $Z^1$, $R^{113}$ in formula (z1) is as defined above.

a is preferably 1 or 2, and is most preferably 1.

n1 is preferably 1 or 2, and is most preferably 1.

n2 is preferably an integer of 0 to 2, more preferably 0 or 1, and most preferably 1.

n5 is preferably an integer of 0 to 2, more preferably 0 or 1, and most preferably 0.

b is preferably an integer of 1 to 4, more preferably 1 or 2, and most preferably 1.

n3 is preferably an integer of 0 to 2, more preferably 0 or 1, and most preferably 1.

n4 is preferably an integer of 0 to 2, more preferably 0 or 1, and most preferably 1.

As the moiety A, the same as those mentioned above for tetravalent linking moiety can be used, and a group represented by the formula (a-1) above is preferable, and a group represented by formula (a-11) is particularly desirable.

In formula (I-1), the plurality of $R^{101}$ may be the same or different from each other. The same also applies to $R^{102}$, $R^{105}$, a, n1, n2, and n5. Further, when n3 and n4 are 2, the plurality of $R^{103}$ and $R^{104}$, respectively, may be the same or different from each other.

In formula (I-1), among the three benzene rings that constitute the triphenylmethane structure, there are no particular limitations on the bonding positions of the moiety A on the benzene rings. However, it is preferable that the moiety A be bonded to the meta position relative to the bonding position of the carbon atom to which three benzene rings are bonded in the triphenylmethane structure. Such compounds offer certain advantages, including the fact that they are ideal for use within a resist composition, and the fact that the compounds are readily synthesized.

There are no particular limitations on the bonding position of the hydroxyl group bearing the subscript a (namely, $-(OH)_a$), but these hydroxyl groups are preferably bonded at least to the para position (position 4) of the phenyl groups, as the compound (A1) is ideal for use within a resist composition and the compound is readily synthesized.

There are no particular limitations on the bonding positions of the groups $R^{101}$, $R^{102}$ and $R^{105}$, but in terms of factors such as the ease of synthesis, $R^{101}$ is preferably bonded to at least one of the carbon atoms adjacent to a carbon atom to which a hydroxyl group is bonded.

There are no particular limitations on the bonding position of the $OZ^1$ group, but the $OZ^1$ group is preferably bonded at least to the para position relative to the bonding position of the moiety A. Such compounds offer certain advantages, including the fact that they are ideal for use within a resist composition, and the fact that the compounds are readily synthesized.

As the phenolic compound (I-1), a compound represented by general formula (I-11) shown below is particularly desirable.

[Chemical Formula 7]

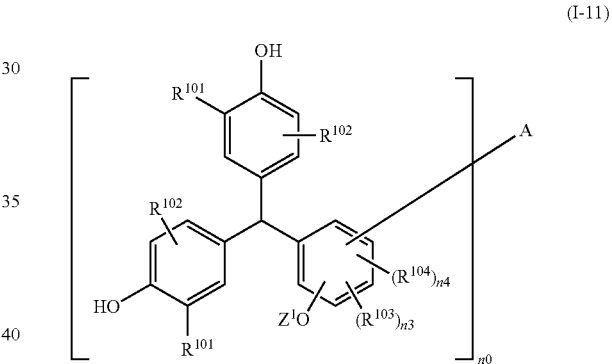

(I-11)

wherein $R^{101}$ to $R^{104}$, $Z^1$, n0, n3 to n4, and A are as defined above.

In the formula above, the plurality of $R^{101}$ may be the same or different from each other, and the same also applies to $R^{102}$.

There are no particular restrictions on the bonding position of $R^{102}$, although in terms of ease of synthesis, it is preferable to be bonded to the position that corresponds to the ortho position relative to the hydroxyl group as well as the meta position relative to $R^{101}$, or the position that corresponds to the meta position relative to the hydroxyl group as well as the para position relative to $R^{101}$.

The $OZ^1$ group is preferably bonded to the para position relative to the bonding position of the moiety A.

There are no particular limitations on the bonding position of $R^{103}$ and $R^{104}$, although in terms of ease of synthesis, it is preferable to be bonded to the ortho position or meta position relative to the hydroxyl group.

The substituted phenolic compound (I'-1) is a compound in which a portion of the hydrogen atoms of (—OH) groups within the above-described phenolic compound (I-1) have been substituted with alkyl groups of 1 to 10 carbon atoms.

As the alkyl group, the same groups as the alkyl groups of 1 to 10 carbon atoms mentioned above for $R^{101}$ to $R^{105}$ can e used.

In the substituted phenolic compound (I'-1), when $Z^1$ is a group represented by formula (z1), it is preferable that the (—OH) groups in which hydrogen atoms have been substituted with alkyl groups of 1 to 10 carbon atoms be only phenolic hydroxyl groups. In other words, as the substituted phenolic compound (I'-1), a compound is preferred in which a portion of, or all of the hydrogen atoms of phenolic hydroxyl groups in the above general formula (I-1) (namely, hydroxyl groups that are directly bonded to benzene rings) have been substituted with the above-mentioned alkyl group, and in which the hydrogen atoms at the terminal of the carboxyl groups have not been substituted with the above-mentioned alkyl group.

[Production Method of Phenolic Compound (I)]

The above phenolic compound (I) can be produced by a conventional method. Examples of the conventional methods include a method in which a tetrasalicylaldehyde derivative in which 4 salicylaldehydes (which may have a substituent) are bonded together via the above-mentioned moiety A is dehydration-condensed with a phenolic compound that may have a substituent under acidic conditions, thereby a obtaining tetra(hydroxyphenyl)methane derivative.

Further, when the phenolic compound (I) includes a carboxyl group-containing group represented by the above formula (z1), the phenolic compound (I) can be produced by reacting the hydroxyl groups within the tetra(hydroxyphenyl)methane derivative with halogenated acetic acid derivatives, such as methyl chloroacetate, or halogenated alkyl benzoic acids, such as a methyl chlorobenzoate derivative and a methyl bromobenzoate derivative, thereby introducing the carboxyl group-containing group.

However, when the phenolic compound (I) includes a carboxyl group-containing group, in this type of conventional method, controlling the hydroxyl group positions and the number of hydroxyl groups at which the carboxyl group-containing groups are introduced is difficult, and the yield tends to be low for the phenolic compound (I).

As a result, when the phenolic compound (I) includes a carboxyl group-containing group, the production method thereof is preferably a method in which a carboxyl group-containing group is first introduced to the hydroxyl groups within the above-mentioned tetrasalicylaldehyde derivative, and the resultant is then subjected to a dehydration-condensation with a phenolic compound that may have a substituent under acidic conditions.

A preferred production method of the phenolic compound (I) used in the present invention will be described below in more detail using the case of the aforementioned phenolic compound (I-1) as an example.

Preferred examples of the production method of the phenolic compound (I-1) in which $Z^1$ includes a group represented by formula (z1) include a production method having: a step of reacting a compound (I-01) represented by a general formula (I-01) shown below and a compound (I-02) represented by a general formula (I-02) shown below to obtain a compound (I-03) represented by a general formula (I-03) shown below (hereafter referred to as the "compound (I-03) formation step"); and a step of obtaining the phenolic compound (I-1) (hereafter referred to as the "compound (I-1) formation step") via a step of reacting the compound (I-03) and a compound (I-04) represented by a general formula (I-04) shown below under acidic conditions.

Preferred examples of the production method of the phenolic compound (I-1) in which $Z^1$ consists solely of hydrogen atoms include a production method having a step of obtaining the phenolic compound (I-1) (hereafter referred to as the "compound (I-1') formation step") via a step of reacting the compound (I-01) represented by a general formula (I-01) shown below and a compound (I-04) represented by a general formula (I-04) shown below under acidic conditions.

The conditions for the compound (I-1') formation step are the same as those for the compound (I-1) formation step.

[Chemical Formula 8]

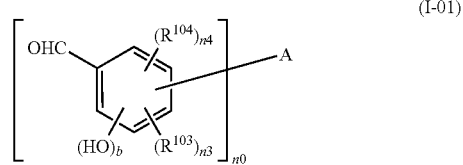

(I-01)

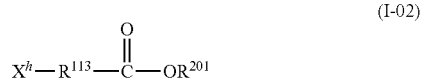

(I-02)

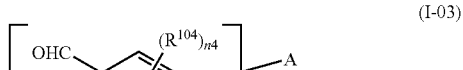

(I-03)

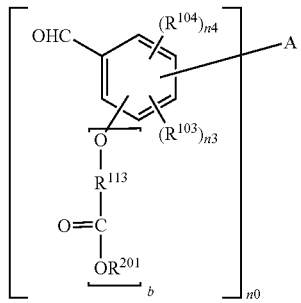

(I-04)

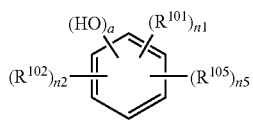

wherein $R^{101}$ to $R^{105}$, n0 to n5, a, b, A and $R^{113}$ are as defined above; $X^h$ represents a halogen atom; and $R^{201}$ represents a protective group.

In general formula (I-02), examples of the halogen atom represented by $X^h$ include a bromine atom, a chlorine atom, and a fluorine atom. A chlorine atom and a bromine atom are preferred as these atoms offer superior reactivity.

There are no particular limitations on the protective group represented by $R^{201}$, as long as it does not react during the reaction of the compound (I-01) with the compound (I-02), and is a group that hydrolyzes under basic conditions. Examples of such groups that hydrolyze under basic conditions include a linear alkyl group of 1 to 4 carbon atoms, preferably a methyl group or an ethyl group.

As the compound (I-02), commercially available compounds can be used.

The compound (I-01) can be obtained, for example, by obtaining a compound (I-01-2) represented by general formula (I-01-2) shown below by introducing a hydroxymethyl group into a compound (I-01-1) represented by general formula (I-01-1) shown below, and formylating an alcoholic hydroxyl group within the compound (I-01-2).

[Chemical Formula 9]

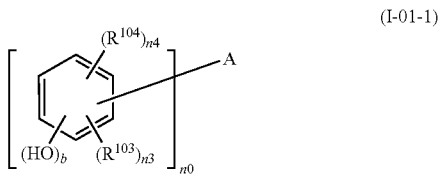

(I-01-1)

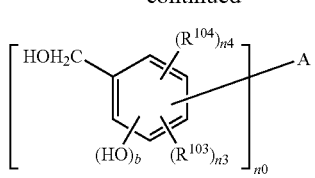

(I-01-2)

wherein $R^{103}$ to $R^{104}$, n0, n3, n4, b, and A are as defined above.

The compound (I-01) and the compound (I-02) can be reacted using conventional methods, for example by dissolving the compound (I-01) in an organic solvent such as N-methylpyrrolidone, adding a base such as potassium carbonate to the solution, and then adding the compound (I-02) to the stirred solution.

The compound (I-02) is preferably used in a quantity that provides approximately 1 to 20 molar equivalents relative to that of the compound (I-01) used, and more preferably 5 to 15 molar equivalents.

The organic solvent used during this reaction may be any solvent capable of dissolving the compound (I-01), the compound (I-02) and the produced compound (I-03), and may be selected appropriately from among typical organic solvents. Specific examples of these typical organic solvents include cyclic amides such as N-methylpyrrolidone; ketones such as acetone, methyl ethyl ketone, methyl pentyl ketone and cyclohexanone; ethers such as tetrahydrofuran (THF), dioxane, glyme and propylene glycol monomethyl ether; esters such as ethyl acetate and ethyl lactate; ether esters such as propylene glycol methyl ether acetate; and lactones such as γ-butyrolactone. These solvents may be used either alone or as mixtures.

The reaction conditions may be selected appropriately in accordance with the combination of used materials, the boiling point of organic solvents, and the like, although the reaction temperature is preferably changed over two stages. For example, the temperature during mixing of the compound (I-01) and the compound (I-02) is preferably within a range from 30 to 80° C., more preferably from 40 to 70° C., and the temperature is then raised so that the subsequent reaction is conducted at a temperature within a range from 60 to 130° C., more preferably from 60 to 120° C.

The reaction time is preferably within a range from 0.5 to 3.5 hours before the temperature increase, more preferably from 1.5 to 3.0 hours, and is preferably within a range from 1 to 24 hours after the temperature increase, more preferably from 3 to 15 hours.

Following completion of the reaction, the reaction solution may be used as it is without modification in the following step; or water and an organic solvent such as methyl isobutyl ketone or ethyl acetate may be added thereto, and then the organic phase (layer) (the phase within the methyl isobutyl ketone or the like) may be concentrated under reduced pressure to obtain the compound (I-03); or the reaction solution may be subjected to an acid deposition process by adding an appropriate amount of acid.

Subsequently, the compound (I-03) and the compound (I-04) are reacted under acidic conditions. This process results in a reaction between the formyl groups (—CHO) of the compound (I-03) and the compound (I-04). Then the protective group $R^{201}$ dissociates by conducting a hydrolysis process under basic conditions, thereby forming the phenolic compound (I-1).

As the compound (I-04), commercially available compounds can be used.

The reaction between the compound (I-03) and the compound (I-04) can be conducted, for example, by dissolving the compound (I-04) in an organic solvent such as methanol, adding an acid such as hydrochloric acid to the solution, and then adding the compound (I-03) to the mixed solution.

The compound (I-04) is preferably used in a quantity that provides approximately 8 to 20 molar equivalents relative to that of the compound (I-03) used, and more preferably 10 to 12 molar equivalents.

There are no particular limitations on the acid used during this step, as long as it is capable of promoting the reaction between the compound (I-03) and the compound (I-04). Specific examples of preferred acids include hydrochloric acid, sulfuric acid, sulfuric anhydride, p-toluenesulfonic acid, methanesulfonic acid, trifluoromethanesulfonic acid, oxalic acid, formic acid, phosphoric acid, trichloroacetic acid and trifluoroacetic acid. Of these, hydrochloric acid is particularly favorable. When a hydrochloric acid gas is used, the gas may be blown into an organic solvent, and it is preferable to blow the gas into an organic solvent before adding the compound (I-04) to the organic solvent. These acids may be used either alone, or in mixtures of two or more different acids.

The amount of acid added may be appropriately adjusted in accordance with the types of acid used.

The reaction conditions may be selected appropriately in accordance with the combination of used materials and the like, although the reaction temperature, for example, is preferably within a range from 10 to 80° C., and more preferably from 30 to 60° C. The reaction time is preferably within a range from 1 to 96 hours, and more preferably from 3 to 72 hours.

Following completion of the reaction, a base such as sodium hydroxide or tetramethylammonium hydroxide is added to the reaction solution to neutralize the acid within the reaction solution. At this time, by adding an excessive amount of base, the protective group $R^{201}$ may be dissociated during the neutralization, or the protective group $R^{201}$ may be dissociated, after the neutralization, by adding more base. The type of the base used for the dissociation may be the same as that used for the neutralization or may be different.

The thus obtained reaction solution is further concentrated if necessary, and then the target product can be obtained, for example, by transferring the obtained reaction solution to a separating funnel for extraction, followed by concentration and drying processes.

[Group Containing an Acid Dissociable, Dissolution Inhibiting Group]

The compound (A1) is a compound in which either a portion of, or all of, the hydrogen atoms of (—OH) groups within the above-mentioned phenolic compound (I) have been substituted with a group containing an acid dissociable, dissolution inhibiting group.

There are no particular limitations on the acid dissociable, dissolution inhibiting group within the group containing an acid dissociable, dissolution inhibiting group, and it may be selected appropriately from those groups proposed for use within the hydroxystyrene-based resins and (meth)acrylate-based resins and the like used in chemically amplified resist compositions designed for use with KrF or ArF excimer lasers. Generally, groups that form either a cyclic or chain-like tertiary alkyl ester with a carboxyl group, and acetal-type acid dissociable, dissolution inhibiting groups such as alkoxyalkyl groups are widely known. The term "(meth)acrylate ester" is a generic term that includes either or both of the acrylate ester having a hydrogen atom bonded to the α-position and the methacrylate ester having a methyl group bonded to the α-position.

Here, a tertiary alkyl ester describes a structure in which an ester is formed by substituting the hydrogen atom of a carboxyl group with a chain-like or cyclic tertiary alkyl group, and a tertiary carbon atom within the chain-like or cyclic tertiary alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may have a substituent.

Hereafter, for the sake of simplicity, groups that exhibit acid dissociability as a result of the formation of a tertiary alkyl ester with a carboxyl group are referred to as "tertiary alkyl ester-type acid dissociable, dissolution inhibiting groups".

Examples of tertiary alkyl ester-type acid dissociable, dissolution inhibiting groups include aliphatic branched, acid dissociable, dissolution inhibiting groups and aliphatic cyclic group-containing acid dissociable, dissolution inhibiting groups.

The term "aliphatic branched" refers to a branched structure having no aromaticity. The "aliphatic branched, acid dissociable, dissolution inhibiting group" is not limited to be constituted of only carbon and hydrogen (not limited to hydrocarbon groups), but is preferably a hydrocarbon group. Further, the "hydrocarbon group" may be either saturated or unsaturated, but in general, the hydrocarbon group is preferably saturated.

Examples of aliphatic branched, acid dissociable, dissolution inhibiting groups include tertiary alkyl groups of 4 to 8 carbon atoms, and specific examples include a tert-butyl group, tert-pentyl group and tert-heptyl group.

The term "aliphatic cyclic group" refers to a monocyclic group or polycyclic group that has no aromaticity.

The "aliphatic cyclic group" may or may not have a substituent. Examples of substituents include a lower alkyl group of 1 to 5 carbon atoms, a lower alkoxy group of 1 to 5 carbon atoms, a fluorine atom, a fluorinated lower alkyl group of 1 to 5 carbon atoms which is substituted with a fluorine atom, and an oxygen atom (=O).

The basic ring of the "aliphatic cyclic group" exclusive of substituents is not limited to be constituted from only carbon and hydrogen (not limited to hydrocarbon groups), but is preferably a hydrocarbon group. Further, the "hydrocarbon group" may be either saturated or unsaturated, but in general, the hydrocarbon group is preferably saturated. Furthermore, the "aliphatic cyclic group" is preferably a polycyclic group.

As such aliphatic cyclic groups, groups in which one or more hydrogen atoms have been removed from a monocycloalkane or a polycycloalkane such as a bicycloalkane, tricycloalkane or tetracycloalkane which may or may not be substituted with a lower alkyl group, a fluorine atom or a fluorinated alkyl group, may be used. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane.

As the aliphatic cyclic group-containing acid dissociable, dissolution inhibiting group, for example, a group which has a tertiary carbon atom on the ring structure of the cycloalkyl group can be mentioned. Specific examples include a 2-methyl-2-adamantyl group, a 2-ethyl-2-adamantyl group, a 1-methyl-1-cyclopentyl group, a 1-ethyl-1-cyclopentyl group, a 1-methyl-1-cyclohexyl group, and a 1-ethyl-1-cyclohexyl group.

Further, as the aliphatic cyclic group-containing acid dissociable, dissolution inhibiting group, groups having an aliphatic cyclic group such as a group represented by general formula —C($R^{15}$)($R^{16}$)—$R^{10}$ [wherein $R^{15}$ and $R^{16}$ represents an alkyl group (which may be either linear or branched, and preferably has 1 to 5 carbon atoms), and $R^{10}$ represents an aliphatic cyclic group], and a branched alkylene group having a tertiary carbon atom bonded thereto, can be used. Examples of the aliphatic cyclic group include the same as those described above, and adamantyl group, cyclohexyl group, cyclopentyl group, norbornyl group, tricyclodecanyl group, and tetracyclododecanyl group are particularly desirable.

An "acetal-type acid dissociable, dissolution inhibiting group" generally substitutes a hydrogen atom at the terminal of an alkali-soluble group such as a carboxyl group or a hydroxyl group, so as to be bonded to an oxygen atom. When acid is generated upon exposure, the generated acid acts to break the bond between the acetal-type acid dissociable, dissolution inhibiting group and the oxygen atom to which the acetal-type, acid dissociable, dissolution inhibiting group is bonded.

Examples of acetal-type acid dissociable, dissolution inhibiting groups include groups represented by general formula (p1) shown below.

[Chemical Formula 10]

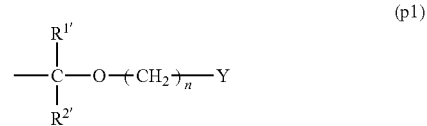

wherein $R^{1'}$ and $R^{2'}$ each independently represents a hydrogen atom or a lower alkyl group; n represents an integer of 0 to 3; and Y represents a linear, branched or cyclic alkyl group and may include a hetero atom within the structure thereof.

In general formula (p1) above, n is preferably an integer of 0 to 2, more preferably 0 or 1, and most preferably 0.

As the lower alkyl group for $R^{1'}$ and $R^{2'}$, the same lower alkyl groups as those for R above can be used. As the lower alkyl group for $R^{1'}$ and $R^{2'}$, a methyl group or ethyl group is preferable, and a methyl group is particularly desirable.

In the present invention, it is preferable that at least one of $R^{1'}$ and $R^{2'}$ be a hydrogen atom. That is, it is preferable that the acid dissociable, dissolution inhibiting group (p1) is a group represented by general formula (p1-1) shown below.

[Chemical Formula 11]

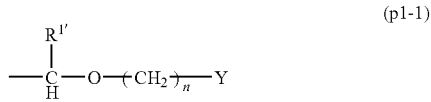

wherein $R^{1'}$, n and Y are respectively as defined above.

The alkyl group represented by Y may include a hetero atom within the structure thereof. In other words, either a portion of, or all of, the hydrogen atoms within the alkyl group for Y may be substituted with a group that contains a hetero atom (including those cases where the hetero atom itself functions as the substituent group), and a portion of the carbon atoms of the alkyl group may also be substituted with a hetero atom. Examples of the hetero atom include an oxygen atom, a sulfur atom, a nitrogen atom, and a fluorine atom.

A "group that contains a hetero atom" may be the hetero atom itself, or a group that contains the hetero atom and a carbon atom and/or hydrogen atom, such as an alkoxy group.

Examples of alkyl groups in which either a portion of, or all of, the hydrogen atoms have been substituted with a hetero atom include fluorinated lower alkyl groups of 1 to 5 carbon atoms in which either a portion of, or all of, the hydrogen atoms have been substituted with fluorine atoms, groups in which two hydrogen atoms bonded to the same carbon atom have been substituted with a single oxygen atom (namely, groups containing a carbonyl group (C=O)), and groups in which two hydrogen atoms bonded to the same carbon atom have been substituted with a single sulfur atom (namely, groups containing a thiocarbonyl group (C=S)).

Examples of groups in which a portion of the carbon atoms of an alkyl group have been substituted with a hetero atom include those in which a carbon atom has been substituted with a nitrogen atom (for example, branched or cyclic alkyl groups containing a —$CH_2$— group within the structure, wherein the —$CH_2$— has been substituted with a —NH— group), and those in which a carbon atom has been substituted with an oxygen atom (for example, branched or cyclic alkyl groups containing a —$CH_2$— group within the structure, wherein the —$CH_2$— has been substituted with a —O— group).

The linear alkyl group represented by Y is preferably an alkyl group of 1 to 5 carbon atoms, and specific examples include a methyl group, an ethyl group, an n-propyl group, an n-butyl group, and n-pentyl group, and a methyl group or an ethyl group is particularly desirable.

The branched alkyl group represented by Y preferably has 4 to 10 carbon atoms, and more preferably 4 to 8 carbon atoms. Specific examples thereof include an isobutyl group, a tert-butyl group, an isopentyl group, a neopentyl group, and a tert-pentyl group, and of these, a tert-butyl group is preferred.

The cyclic alkyl group represented by Y preferably has 3 to 20 carbon atoms, more preferably 4 to 14 carbon atoms, and most preferably 5 to 12 carbon atoms.

The basic ring structure within the cyclic alkyl group (namely, the basic ring exclusive of substituents) may be either monocyclic or polycyclic, and a polycyclic structure is particularly desirable in terms of achieving superior effects for the present invention. Further, the basic ring may be either a hydrocarbon ring formed solely from carbon and hydrogen, or a heterocycle in which a portion of the carbon atoms that constitute a hydrocarbon ring have been substituted with hetero atoms. In the present invention, it is particularly desirable that the base ring be a hydrocarbon ring. Examples of the hydrocarbon ring include a monocycloalkane, a bicycloalkane, a tricycloalkane and a tetracycloalkane. Specific examples thereof include a monocycloalkane such as cyclopentane and cyclohexane, and a polycycloalkane such as adamantane, norbornane, isobornane, tricyclodecane and tetracyclododecane. Of these, adamantane, norbornane, tricyclodecane and tetracyclododecane are preferable, and adamantane is particularly desirable.

These basic ring structures may include a substituent on the ring, or may have no substituents.

Examples of substituents include a lower alkyl group, a fluorine atom, a fluorinated lower alkyl group, and an oxygen atom (=O). Examples of the lower alkyl group include linear or branched alkyl groups of 1 to 5 carbon atoms such as a methyl group and an ethyl group. In those cases where the basic ring structure includes a substituent, the number of substituents is preferably within a range from 1 to 3, and is more preferably 1.

The expression "includes a substituent" means that a hydrogen atom bonded to a carbon atom that constitutes the basic ring structure has been substituted with the substituent.

Examples of the cyclic alkyl group represented by Y include a group in which one hydrogen atom has been removed from the above type of basic ring structure.

Further, as the acetal-type, acid dissociable, dissolution inhibiting group, groups represented by general formula (p2) shown below can also be used.

[Chemical Formula 12]

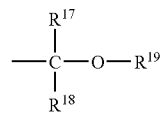

(p2)

wherein $R^{17}$ and $R^{18}$ each independently represents a linear or branched alkyl group or a hydrogen atom; and $R^{19}$ represents a linear, branched or cyclic alkyl group; or $R^{17}$ and $R^{19}$ each independently represents a linear or branched alkylene group, wherein the terminal of $R^{17}$ may be bonded to the terminal of $R^{19}$ to form a ring.

The alkyl group for $R^{17}$ and $R^{18}$ preferably has 1 to 15 carbon atoms, and may be either linear or branched. As the alkyl group, an ethyl group or a methyl group is preferable, and a methyl group is most preferable.

It is particularly desirable that either one of $R^{17}$ and $R^{18}$ be a hydrogen atom, and the other be a methyl group.

$R^{19}$ represents a linear, branched or cyclic alkyl group which preferably has 1 to 15 carbon atoms, and may be any of linear, branched or cyclic.

When $R^{19}$ represents a linear or branched alkyl group, it is preferably an alkyl group of 1 to 5 carbon atoms, more preferably an ethyl group or a methyl group, and most preferably an ethyl group.

When $R^{19}$ represents a cyclic alkyl group, it preferably has 4 to 15 carbon atoms, more preferably 4 to 12 carbon atoms, and most preferably 5 to 10 carbon atoms. As examples of the cyclic alkyl group, groups in which one or more hydrogen atoms have been removed from a monocycloalkane or a polycycloalkane such as a bicycloalkane, tricycloalkane or tetracycloalkane, which may or may not be substituted with a fluorine atom or a fluorinated alkyl group, may be mentioned. Specific examples include groups in which one or more hydrogen atoms have been removed from a monocycloalkane such as cyclopentane or cyclohexane, and groups in which one or more hydrogen atoms have been removed from a polycycloalkane such as adamantane, norbornane, isobornane, tricyclodecane or tetracyclododecane. Among these, a group in which one or more hydrogen atoms have been removed from adamantane is preferable.

In general formula (p2) above, $R^{17}$ and $R^{19}$ may each independently represent a linear or branched alkylene group (preferably an alkylene group of 1 to 5 carbon atoms), and the terminal of $R^{19}$ may be bonded to the terminal of $R^{17}$.

In such a case, a cyclic group is formed by $R^{17}$, $R^{19}$, the oxygen atom having $R^{19}$ bonded thereto and the carbon atom having the oxygen atom and $R^{17}$ bonded thereto. Such a cyclic group is preferably a 4 to 7-membered ring, and more preferably a 4 to 6-membered ring. Specific examples of the cyclic group include a tetrahydropyranyl group and a tetrahydrofuranyl group.

The group containing an acid dissociable, dissolution inhibiting group included in the compound (A1) may be a group composed solely of the acid dissociable, dissolution inhibiting group as described above, or may be a group composed of the acid dissociable, dissolution inhibiting group as well as a group or atom other than the acid dissociable, dissolution inhibiting group.

Examples of the group composed of an acid dissociable, dissolution inhibiting group as well as a group or atom other than the acid dissociable, dissolution inhibiting group include a group represented by formula $X^1$—O—C(=O)— and a group represented by formula $X^1$—O—C(=O)—$R^9$.

In the above formulas, $X^1$ represents an acid dissociable, dissolution inhibiting group, and $R^9$ represents a linear or branched alkylene group. The alkylene group is preferably an alkylene group of 1 to 5 carbon atoms, and more preferably an alkylene group of 1 to 3 carbon atoms.

In terms of achieving superior effects for the present invention, it is particularly desirable that the compound (A1) include at least one group selected from the group consisting of a group represented by general formula (p11) shown below and a group represented by general formula (p12) shown below, as the group containing an acid dissociable, dissolution inhibiting group.

[Chemical Formula 13]

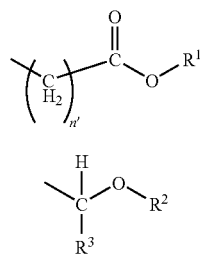

wherein $R^1$ represents an acid dissociable, dissolution inhibiting group and $R^2$ represents a linear, branched or cyclic alkyl group and may include a hetero atom within the structure thereof $R^3$ represents a hydrogen atom or a lower alkyl group; and n' represents an integer of 1 to 3.

In general formula (p11), n' represents an integer of 1 to 3, and is most preferably 1.

As the acid dissociable, dissolution inhibiting group represented by $R^1$, the same acid dissociable, dissolution inhibiting groups as those described above can be used. Of these, tertiary alkyl ester-type acid dissociable, dissolution inhibiting groups are preferable, and aliphatic cyclic group-containing acid dissociable, dissolution inhibiting groups are particularly desirable.

Preferred examples of groups represented by formula (p11) include groups represented by formulas (p11-1) to (p11-7) shown below. Of these, a group represented by general formula (p11-1) is preferable.

[Chemical Formula 14]

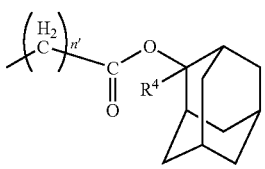

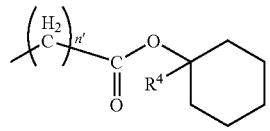

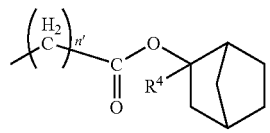

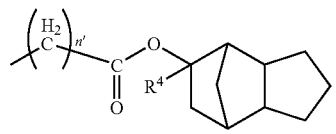

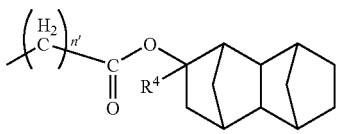

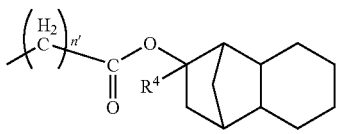

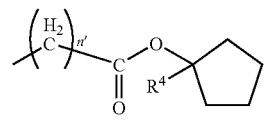

wherein $R^4$ represents a lower alkyl group, and n' is as defined above.

The lower alkyl group represented by $R^4$ is an alkyl group of 1 to 5 carbon atoms and specific examples thereof include linear or branched lower alkyl groups such as a methyl group, ethyl group, propyl group, isopropyl group, n-butyl group, isobutyl group, tert-butyl group, pentyl group, isopentyl group, and neopentyl group. In view of industrial availability, $R^4$ is preferably a methyl group or an ethyl group, and is most preferably a methyl group.

In formula (p12), $R^3$ represents a hydrogen atom or a lower alkyl group. The lower alkyl group represented by $R^3$ is an alkyl group of 1 to 5 carbon atoms and specific examples thereof include linear or branched lower alkyl groups such as a methyl group, ethyl group, propyl group, isopropyl group, n-butyl group, isobutyl group, tert-butyl group, pentyl group, isopentyl group, and neopentyl group. In view of industrial availability, $R^3$ is preferably a hydrogen atom or a methyl group, and is most preferably a hydrogen atom.

As $R^2$, the same groups as those described above for Y may be used.

$R^2$ is preferably a linear alkyl group or a cyclic alkyl group.

When $R^2$ is a linear alkyl group, specific examples of the group represented by formula (p12) include a 1-ethoxyethyl group, 1-ethoxymethyl group, 1-methoxyethyl group, 1-methoxymethyl group, 1-methoxypropyl group, 1-ethoxypropyl group, 1-n-butoxyethyl group, 1-pentafluoroethoxyethyl group, 1-trifluoromethoxyethyl group, and 1-trifluoromethoxymethyl group.

When $R^2$ is a cyclic alkyl group, specific examples of the group represented by formula (p12) include those represented by formulas shown below.

[Chemical Formula 15]

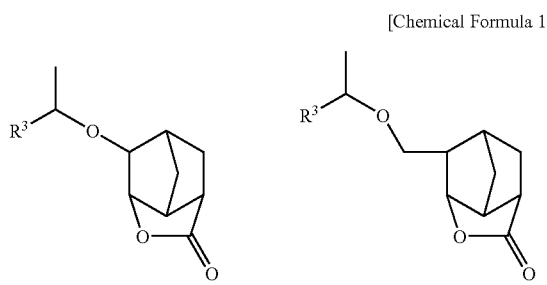
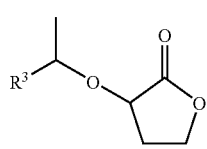
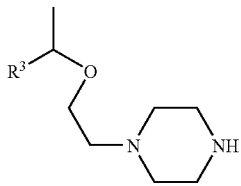
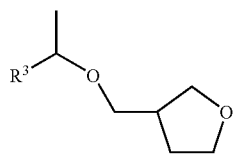
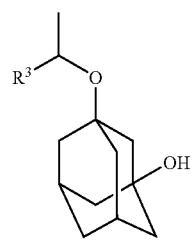
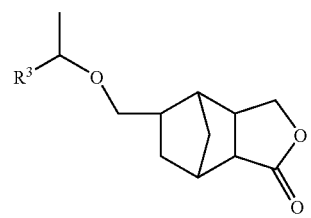
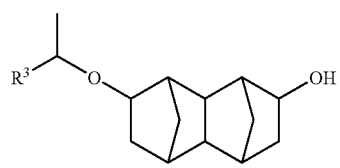
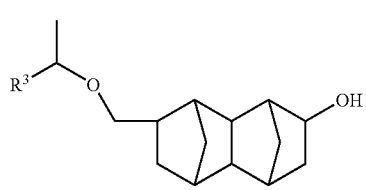

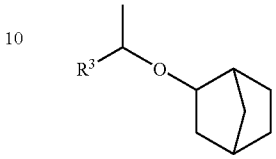
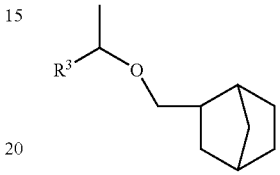
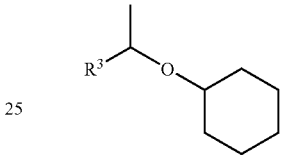
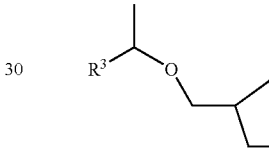
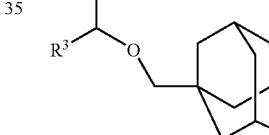
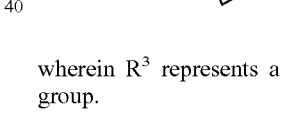

wherein $R^3$ represents a hydrogen atom or a lower alkyl group.

Of these, a group represented by general formula (p12-1) or (p12-2) shown below is preferable.

[Chemical Formula 16]

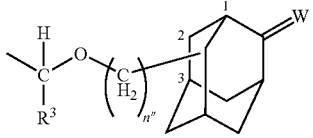
(p12-1)

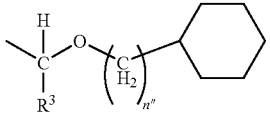
(p12-2)

wherein $R^3$ represents a hydrogen atom or a lower alkyl group, each of $n''$ independently represents an integer of 0 to 2, and W represents either two hydrogen atoms or an oxygen atom.

$n''$ is most preferably either 0 or 1.

There are no particular limitations on the bonding position between the adamantyl group and the —CHR$^3$—O—(CH$_2$)$_{n''}$— group, although bonding at either position 1 or position 2 of the adamantyl group is preferred.

In the compound (A1), the group containing an acid dissociable, dissolution inhibiting group is preferably a group having a cyclic group, such as the groups represented by the above formulas (p11-1) to (p11-7) and (p12-1) to (p12-2), as such groups yield superior effects for the present invention. Compared with those cases where the acid dissociable, dissolution inhibiting group is a chain-like group, when an acid dissociable, dissolution inhibiting group is a group having a cyclic group, a lower solubility of the compound (A1) in an alkali developing solution can be attained. Therefore, when the compound (A1) is blended into a positive resist composition, the resistance to alkali developing solutions is increased for the unexposed portions of a resist film formed using the positive resist composition. As a result, the difference in alkali solubility between the exposed portions and the unexposed portions (the solubility contrast) increases, and the resolution improves.

The compound (A1) can be produced by substituting either a portion of, or all of, the hydrogen atoms of (—OH) groups within the phenolic compound (I) with groups containing an acid dissociable, dissolution inhibiting group, by using known methods.

At this time, the "(—OH) groups within the phenolic compound (I)", in which the hydrogen atoms have been substituted with groups containing an acid dissociable, dissolution inhibiting group, refer to a portion or all of the phenolic hydroxyl groups (—OH) and the carboxyl hydroxyl groups within the phenolic compound (I).

Compared with the phenolic hydroxyl groups, the carboxyl hydroxyl groups exhibit higher reactivity. As a result, in the compound (A1) obtained by the above-mentioned manner, all of the hydrogen atoms of the carboxyl groups within the compound molecules are usually substituted with the groups containing an acid dissociable, dissolution inhibiting group, whereas the hydrogen atoms of the phenolic hydroxyl groups are not substituted with the groups containing an acid dissociable, dissolution inhibiting group at all.

The compound as described above in which all of the hydrogen atoms in the carboxyl groups within the compound molecules are substituted with the groups containing an acid dissociable, dissolution inhibiting group, whereas the hydrogen atoms in the phenolic hydroxyl groups are not substituted with the groups containing an acid dissociable, dissolution inhibiting group at all, is not only easy to produce but is also capable of forming a resist pattern having superior lithography properties, such as the resolution, and an excellent shape with reduced levels of roughness and footing when the compound is used within a resist composition.

The compound (A1) preferably has a molecular weight within a range from 1,000 to 4,000.

When the molecular weight is not less than 1,000, the film-forming ability is improved, and a nano level resist pattern can be readily formed. The molecular weight is preferably not less than 1,500, and more preferably not less than 1,800.

On the other hand, when the molecular weight is not greater than 4,000, a resist pattern having excellent resolution with a reduced level of roughness as well as a favorable shape can be formed. The molecular weight is preferably not greater than 3,500, and more preferably not greater than 3,300.

The molecular weight of the compound (A1) can be calculated from the structure of the compound, which can be confirmed by a general organic analysis method such as $^1$H-nuclear magnetic resonance (NMR) spectrometry, $^{13}$C-NMR spectrometry, $^{19}$F-NMR spectrometry, infrared absorption (IR) spectrometry, mass spectrometry (MS), elementary analysis and X-ray crystal diffraction analysis.

The compound (A1) is a material that is capable of forming an amorphous (non-crystalline) film using a spin coating method. Here, an amorphous film refers to an optically transparent film that does not crystallize.

The spin coating method is one of the most commonly used methods for forming thin films.

A judgment as to whether or not the compound is a material capable of forming an amorphous film using the spin coating method is determined on the basis of whether or not a film formed by spin-coating the compound onto an 8-inch silicon wafer is transparent across the entire film surface. More specifically, judgment can be conducted, for example, in the manner described below. First, the compound is added to a solvent typically used as a resist solvent, such as a mixed solvent of ethyl lactate and propylene glycol monomethyl ether acetate in a ratio (weight ratio) of 40/60 (hereafter this solvent is abbreviated as EM), in sufficient quantity to generate a solution with a concentration of 14% by weight, and dissolution of the compound is achieved by ultrasound treatment (dissolution treatment) using an ultrasonic cleaning apparatus. The resulting solution is spin-coated onto a wafer at 1,500 rpm and subjected to optional drying and baking (PAB, Post Applied Bake) at 110° C. for 90 seconds, and a visual judgment is then made as to whether the formed film is transparent, thereby confirming whether or not an amorphous film has been formed. A non-transparent, cloudy film is not an amorphous film.

In the present invention, the compound (A1) preferably generates an amorphous film via the above method that exhibits favorable stability, and for example, compounds for which the amorphous state of the film is retained even after standing for 2 weeks at room temperature following the above PAB treatment are particularly desirable.

It is particularly desirable that the compound (A1) be a compound in which Z$^1$ within the above-described phenolic compound (I-1) is a group represented by formula (z1), the hydrogen atoms of the carboxyl groups at the terminals thereof are substituted with groups containing an acid dissociable, dissolution inhibiting group, and the hydrogen atoms of the phenolic hydroxyl groups are not substituted with the groups containing an acid dissociable, dissolution inhibiting group. In other words, the compound (A1) is preferably a compound in which Z$^1$ in the above general formula (I-1) is a group represented by formula —R$^{113}$—C(=O)—O—R" [wherein R$^{113}$ is as defined above, and R" represents a group containing an acid dissociable, dissolution inhibiting group].

Examples of the group containing an acid dissociable, dissolution inhibiting group represented by R" include the same groups containing an acid dissociable, dissolution inhibiting group as those mentioned above.

In the component (A), the compound (A1) may use either a single compound, or a combination of two or more different compounds.

The proportion of the compound (A1) within the component (A) is preferably greater than 40% by weight, more preferably greater than 50% by weight, even more preferably greater than 80% by weight, and is most preferably 100% by weight. The proportion of the compound (A1) within the component (A) can be measured using a technique such as reverse-phase chromatography.

The component (A) may also include a "base material component that exhibits increased solubility in an alkali developing solution under the action of acid" other than the compound (A1) (hereafter also referred to as the component (A2)), provided the inclusion of the component does not impair the effects obtained by using the compound (A1). Examples of the component (A2) include any of the materials proposed as base resins for conventional chemically amplified positive resist compositions for use with a KrF excimer laser or positive resist compositions for use with an ArF excimer laser, and these can be selected in accordance with the nature of the exposure light source used during resist pattern formation.

The quantity of the component (A) within the positive resist composition may be adjusted in accordance with the film thickness of the resist to be formed.

<Component (B)>

There are no particular limitations on the component (B), and any of the acid generators proposed for use within conventional chemically amplified resists can be used. Examples of these acid generators are numerous, and include onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzyl sulfonate-based acid generators; iminosulfonate-based acid generators; and disulfone-based acid generators.

As an onium salt-based acid generator, a compound represented by general formula (b-1) or (b-2) shown below can be used.

[Chemical Formula 17]

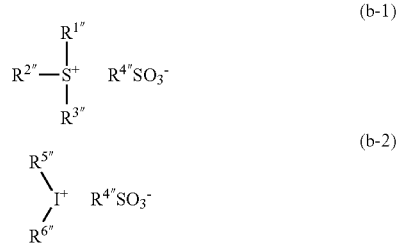

wherein $R^{1''}$ to $R^{3''}$, $R^{5''}$ and $R^{6''}$ each independently represents an aryl group or alkyl group, wherein two of $R^{1''}$ to $R^{3''}$ in formula (b-1) may be bonded to each other to form a ring with the sulfur atom; $R^{4''}$ represents an alkyl group which may have a substituent, a halogenated alkyl group, an aryl group or an alkenyl group; at least one of $R^{1''}$ to $R^{3''}$ represents an aryl group, and at least one of $R^{5''}$ and $R^{6''}$ represents an aryl group.

In formula (b-1), $R^{1''}$ to $R^{3''}$ each independently represents an aryl group or an alkyl group. In formula (b-1), two of $R^{1''}$ to $R^{3''}$ may be bonded to each other to form a ring with the sulfur atom in the formula.

Further, among $R^{1''}$ to $R^{3''}$, at least one group represents an aryl group. Among $R^{1''}$ to $R^{3''}$, two or more groups are preferably aryl groups, and it is particularly desirable that all of $R^{1''}$ to $R^{3''}$ be aryl groups.

The aryl group for $R^{1''}$ to $R^{3''}$ is not particularly limited. For example, an aryl group having 6 to 20 carbon atoms may be used in which some or all of the hydrogen atoms of the aryl group may or may not be substituted with alkyl groups, alkoxy groups, halogen atoms or hydroxyl groups.

The aryl group is preferably an aryl group having 6 to 10 carbon atoms because it can be synthesized at a low cost. Specific examples thereof include a phenyl group and a naphthyl group.

The alkyl group, with which hydrogen atoms of the aryl group may be substituted, is preferably an alkyl group having 1 to 5 carbon atoms, and most preferably a methyl group, an ethyl group, a propyl group, an n-butyl group, or a tert-butyl group.

The alkoxy group, with which hydrogen atoms of the aryl group may be substituted, is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

The halogen atom, with which hydrogen atoms of the aryl group may be substituted, is preferably a fluorine atom.

The alkyl group for $R^{1''}$ to $R^{3''}$ is not particularly limited and includes, for example, a linear, branched or cyclic alkyl group having 1 to 10 carbon atoms. In terms of achieving excellent resolution, the alkyl group preferably has 1 to 5 carbon atoms. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and of these, a methyl group is most preferable because it is excellent in resolution and can be synthesized at a low cost.

It is particularly desirable that each of $R^{1''}$ to $R^{3''}$ be a phenyl group which may have a substituent or a naphthyl group which may have a substituent.

When two of $R^{1''}$ to $R^{3''}$ in formula (b-1) are bonded to each other to form a ring with the sulfur atom in the formula, it is preferable that the two of $R^{1''}$ to $R^{3''}$ form a 3 to 10-membered ring including the sulfur atom, and it is particularly desirable that the two of $R^{1''}$ to $R^{3''}$ form a 5 to 7-membered ring including the sulfur atom.

When two of $R^{1''}$ to $R^{3''}$ in formula (b-1) are bonded to each other to form a ring with the sulfur atom in the formula, the remaining one of $R^{1''}$ to $R^{3''}$ is preferably an aryl group. As examples of the aryl group, the same aryl groups as those for $R^{1''}$ to $R^{3''}$ can be used.

Preferred examples of the cation moiety of the compound represented by formula (b-1) include the cation moieties represented by formulas (I-1-1) to (I-1-10) shown below. Of these, the cation moieties having a triphenylmethane structure such as those represented by formulas (I-1-1) to (I-1-8) are preferable.

In the formulas (I-1-9) to (I-1-10) shown below, each of $R^9$ and $R^{10}$ independently represents a phenyl group which may have a substituent, a naphthyl group which may have a substituent, an alkyl group of 1 to 5 carbon atoms, an alkoxy group, or a hydroxyl group.

u represents an integer of 1 to 3, and is most preferably 1 or 2.

[Chemical Formula 18]

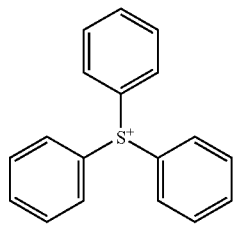

(I-1-1)

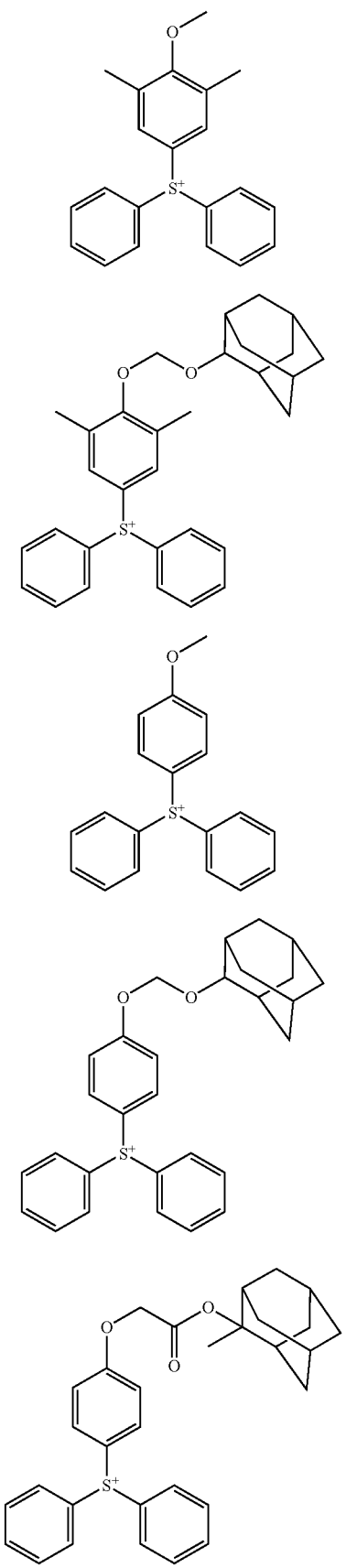

(I-1-2)
(I-1-3)
(I-1-4)
(I-1-5)
(I-1-6)
(I-1-7)
(I-1-8)

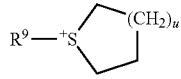

(I-1-9)

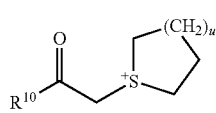

(I-1-10)

R$^{4''}$ represents an alkyl group, a halogenated alkyl group, an aryl group or an alkenyl group which may have a substituent.

The alkyl group for R$^{4''}$ may be any of linear, branched or cyclic.

The linear or branched alkyl group preferably has 1 to 10 carbon atoms, more preferably 1 to 8 carbon atoms, and most preferably 1 to 4 carbon atoms.

The cyclic alkyl group preferably has 4 to 15 carbon atoms, more preferably 4 to 10 carbon atoms, and most preferably 6 to 10 carbon atoms.

As an example of the halogenated alkyl group for R$^{4''}$, a group in which part of or all of the hydrogen atoms of the aforementioned linear, branched or cyclic alkyl group have been substituted with halogen atoms can be given. Examples of the halogen atom include a fluorine atom, a chlorine atom, a bromine atom and an iodine atom, and a fluorine atom is particularly desirable.

In the halogenated alkyl group, the percentage of the number of halogen atoms based on the total number of halogen atoms and hydrogen atoms (that is, halogenation ratio (%)) is preferably 10 to 100%, more preferably 50 to 100%, and most preferably 100%. Higher halogenation ratio is preferable because the acid strength increases.

The aryl group for R$^{4''}$ is preferably an aryl group of 6 to 20 carbon atoms.

The alkenyl group for R$^{4''}$ is preferably an alkenyl group of 2 to 10 carbon atoms.

With respect to R$^{4''}$, the expression "may have a substituent" means that part of or all of the hydrogen atoms within the aforementioned linear, branched or cyclic alkyl group, halogenated alkyl group, aryl group or alkenyl group may be substituted with substituents (atoms other than hydrogen atoms, or groups).

$R^{4'''}$ may have one substituent, or two or more substituents.

Examples of the substituent include a halogen atom, a hetero atom, an alkyl group, and a group represented by the formula $X-Q^1-$ [in the formula, $Q^1$ represents a divalent linking group containing an oxygen atom; and X represents a hydrocarbon group of 3 to 30 carbon atoms which may have a substituent].

Examples of halogen atoms and alkyl groups as substituents include the same halogen atoms and alkyl groups as those described above with respect to the halogenated alkyl group for $R^{4'''}$.

Examples of the hetero atom include an oxygen atom, a nitrogen atom, and a sulfur atom.

In the group represented by formula $X-Q^1-$, $Q^1$ represents a divalent linking group containing an oxygen atom.

$Q^1$ may contain an atom other than the oxygen atom. Examples of the atom other than the oxygen atom include a carbon atom, a hydrogen atom, a sulfur atom and a nitrogen atom.

Examples of divalent linking groups containing an oxygen atom include "non-hydrocarbon, oxygen atom-containing linking groups" such as an oxygen atom (an ether bond; —O—), an ester bond (—C(=O)—O—), an amide bond (—C(=O)—NH—), a carbonyl group (—C(=O)—) and a carbonate group (—O—C(=O)—O—); and combinations of the aforementioned non-hydrocarbon, oxygen atom-containing linking groups with an alkylene group.

Specific examples of the combinations of the aforementioned non-hydrocarbon, oxygen atom-containing linking groups and an alkylene group include —$R^{91}$—O—, —$R^{92}$—O—C(=O)—, —C(=O)—O—$R^{93}$—, and —C(=O)—O—$R^{93}$—O—C(=O)— (in the formulas, each of $R^{91}$ to $R^{93}$ independently represents an alkylene group).

The alkylene group for $R^{91}$ to $R^{93}$ is preferably a linear or branched alkylene group, and preferably has 1 to 12 carbon atoms, more preferably 1 to 5 carbon atoms, and most preferably 1 to 3 carbon atoms.

Specific examples of alkylene groups include a methylene group [—CH$_2$—]; alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; alkylethylene groups such as —CH(CH$_3$)CH$_2$—, —CH(CH$_3$)CH(CH$_3$)—, —C(CH$_3$)$_2$CH$_2$—, and —CH(CH$_2$CH$_3$)CH$_2$—; a trimethylene group (n-propylene group) [—CH$_2$CH$_2$CH$_2$—]; alkyltrimethylene groups such as —CH(CH$_3$)CH$_2$CH$_2$— and —CH$_2$CH(CH$_3$)CH$_2$—; a tetramethylene group [—CH$_2$CH$_2$CH$_2$CH$_2$—]; alkyltetramethylene groups such as —CH(CH$_3$)CH$_2$CH$_2$CH$_2$— and —CH$_2$CH(CH$_3$)CH$_2$CH$_2$—; and a pentamethylene group [—CH$_2$CH$_2$CH$_2$CH$_2$CH$_2$—].

As $Q^1$, a divalent linking group containing an ester bond or an ether bond is preferable, and a group represented by formula —$R^{91}$—O—, —$R^{92}$—O—C(=O)—, —C(=O)—O—, —C(=O)—O—$R^{93}$— or —C(=O)—O—$R^{93}$—O—C(=O)— is more preferable.

In the group represented by the formula $X-Q^1-$, the hydrocarbon group for X may be either an aromatic hydrocarbon group or an aliphatic hydrocarbon group.

An aromatic hydrocarbon group is a hydrocarbon group having an aromatic ring. The aromatic hydrocarbon ring preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms. Here, the number of carbon atoms within a substituent(s) is not included in the number of carbon atoms of the aromatic hydrocarbon group.

Specific examples of aromatic hydrocarbon groups include an aryl group in which one hydrogen atom has been removed from an aromatic hydrocarbon ring, such as a phenyl group, a biphenyl group, a fluorenyl group, a naphthyl group, an anthryl group or a phenanthryl group; and an arylalkyl group such as a benzyl group, a phenethyl group, a 1-naphthylmethyl group, a 2-naphthylmethyl group, a 1-naphthylethyl group, or a 2-naphthylethyl group. The alkyl chain within the arylalkyl group preferably has 1 to 4 carbon atom, more preferably 1 or 2 carbon atoms, and most preferably 1 carbon atom.

The aromatic hydrocarbon group may have a substituent. For example, a part of the carbon atoms constituting the aromatic ring within the aromatic hydrocarbon group may be substituted with a hetero atom, or a hydrogen atom bonded to the aromatic ring within the aromatic hydrocarbon group may be substituted with a substituent.

In the former example, a heteroaryl group in which a part of the carbon atoms constituting the ring within the aforementioned aryl group has been substituted with a hetero atom such as an oxygen atom, a sulfur atom or a nitrogen atom, and a heteroarylalkyl group in which a part of the carbon atoms constituting the aromatic hydrocarbon ring within the aforementioned arylalkyl group has been substituted with the aforementioned hetero atom can be used.

In the latter example, as the substituent for the aromatic hydrocarbon group, an alkyl group, an alkoxy group, a halogen atom, a halogenated alkyl group, a hydroxyl group, an oxygen atom (=O) or the like can be used.

The alkyl group as the substituent for the aromatic hydrocarbon group is preferably an alkyl group of 1 to 5 carbon atoms, and a methyl group, an ethyl group, a propyl group, an n-butyl group or a tert-butyl group is particularly desirable.

The alkoxy group as the substituent for the aromatic hydrocarbon group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent for the aromatic hydrocarbon group include a fluorine atom, a chlorine atom, a bromine atom and an iodine atom, and a fluorine atom is preferable.

Example of the halogenated alkyl group as the substituent for the aromatic hydrocarbon group includes a group in which a part or all of the hydrogen atoms within the aforementioned alkyl group have been substituted with the aforementioned halogen atoms.

The aliphatic hydrocarbon group for X may be either a saturated aliphatic hydrocarbon group, or an unsaturated aliphatic hydrocarbon group. Further, the aliphatic hydrocarbon group may be any of linear, branched or cyclic.

In the aliphatic hydrocarbon group for X, a part of the carbon atoms constituting the aliphatic hydrocarbon group may be substituted with a substituent group containing a hetero atom, or a part or all of the hydrogen atoms constituting the aliphatic hydrocarbon group may be substituted with a substituent group containing a hetero atom.

As the "hetero atom" in X, there is no particular limitation as long as it is an atom other than a carbon atom and a hydrogen atom, and examples thereof include a halogen atom, an oxygen atom, a sulfur atom and a nitrogen atom. Examples of halogen atoms include a fluorine atom, a chlorine atom, an iodine atom and a bromine atom.

The substituent group containing a hetero atom may consist solely of the above hetero atom, or may be a group containing a group or atom other than the above hetero atom.

Specific examples of the substituent group with which a part of the carbon atoms is substituted include —O—, —C(=O)—O—, —C(=O)—, —O—C(=O)—O—, —C(=O)—NH—, —NH— (the H may be replaced with a substituent such as an alkyl group or an acyl group), —S—, —S(=O)$_2$— and —S(=O)$_2$—O—. When the aliphatic hydrocarbon group is cyclic, the aliphatic hydrocarbon group may contain these substituent groups in the ring structure.

Examples of the substituent group with which a part or all of the hydrogen atoms is substituted include an alkoxy group, a halogen atom, a halogenated alkyl group, a hydroxyl group, an oxygen atom (=O) and a cyano group.

The aforementioned alkoxy group is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the aforementioned halogen atom include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

As the aliphatic hydrocarbon group, a linear or branched saturated hydrocarbon group, a linear or branched monovalent unsaturated hydrocarbon group, or a cyclic aliphatic hydrocarbon group (aliphatic cyclic group) is preferable.

The linear saturated hydrocarbon group (alkyl group) preferably has 1 to 20 carbon atoms, more preferably 1 to 15 carbon atoms, and most preferably 1 to 10 carbon atoms. Specific examples include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched saturated hydrocarbon group (alkyl group) preferably has 3 to 20 carbon atoms, more preferably 3 to 15 carbon atoms, and most preferably 3 to 10 carbon atoms. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

The unsaturated hydrocarbon group preferably has 2 to 10 carbon atoms, more preferably 2 to 5 carbon atoms, still more preferably 2 to 4 carbon atoms, and most preferably 3 carbon atoms. Examples of linear monovalent unsaturated hydrocarbon groups include a vinyl group, a propenyl group (an allyl group) and a butynyl group. Examples of branched monovalent unsaturated hydrocarbon groups include a 1-methylpropenyl group and a 2-methylpropenyl group.

Among the above-mentioned examples, as the unsaturated hydrocarbon group, a propenyl group is particularly desirable.

The aliphatic cyclic group may be either a monocyclic group or a polycyclic group. The aliphatic cyclic group preferably has 3 to 30 carbon atoms, more preferably 5 to 30 carbon atoms, still more preferably 5 to 20 carbon atoms, still more preferably 6 to 15 carbon atoms, and most preferably 6 to 12 carbon atoms.

Examples thereof include groups in which one or more of the hydrogen atoms have been removed from a monocycloalkane; and groups in which one or more of the hydrogen atoms have been removed from a polycycloalkane such as a bicycloalkane, a tricycloalkane, or a tetracycloalkane. Specific examples include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane or tetracyclododecane.

When the aliphatic cyclic group does not contain a hetero atom-containing substituent group in the ring structure thereof, the aliphatic cyclic group is preferably a polycyclic group, more preferably a group in which one or more hydrogen atoms have been removed from a polycycloalkane, and most preferably a group in which one or more hydrogen atoms have been removed from adamantane.

When the aliphatic cyclic group contains a hetero atom-containing substituent group in the ring structure thereof, the hetero atom-containing substituent group is preferably —O—, —C(=O)—O—, —S—, —S(=O)$_2$— or —S(=O)$_2$—O—. Specific examples of such aliphatic cyclic groups include groups represented by formulas (L1) to (L5) and (S1) to (S4) shown below.

[Chemical Formula 19]

(L1)

(L2)

(L3)

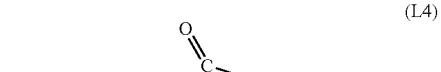

(L4)

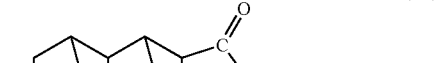

(L5)

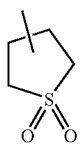
(S1)

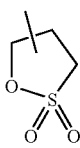
(S2)

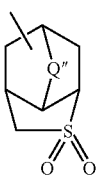
(S3)

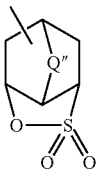
(S4)

wherein Q" represents an alkylene group of 1 to 5 carbon atoms, —O—, —S—, —O—R$^{94}$— or —S—R$^{95}$— (wherein each of R$^{94}$ and R$^{95}$ independently represents an alkylene group of 1 to 5 carbon atoms); and m represents an integer of 0 or 1.

In the above formula, as the alkylene group for Q", R$^{94}$ and R$^{95}$, the same alkylene groups as those described above for R$^{91}$ to R$^{93}$ can be used.

In these aliphatic cyclic groups, a part of the hydrogen atoms boned to the carbon atoms constituting the ring structure may be substituted with a substituent. Examples of substituents include an alkyl group, an alkoxy group, a halogen atom, a halogenated alkyl group, a hydroxyl group and an oxygen atom (═O).

As the alkyl group, an alkyl group of 1 to 5 carbon atoms is preferable, and a methyl group, an ethyl group, a propyl group, an n-butyl group or a tert-butyl group is particularly desirable.

As the alkoxy group and the halogen atom, the same groups as the aforementioned substituent groups with which a part or all of the hydrogen atoms is substituted can be used.

In the present invention, X is preferably a cyclic group which may have a substituent. The cyclic group may be an aromatic hydrocarbon group which may have a substituent or an aliphatic cyclic group which may have a substituent, and an aliphatic cyclic group which may have a substituent is preferable.

The aromatic hydrocarbon group is preferably a naphthyl group which may have a substituent or a phenyl group which may have a substituent.

As the aliphatic cyclic group which may have a substituent, an aliphatic polycyclic group which may have a substituent is preferable. As the aliphatic polycyclic group, the aforementioned groups in which one or more hydrogen atoms have been removed from polycycloalkanes, the aforementioned groups represented by formulas (L2) to (L5) and (S3) to (S4), and the like are preferable.

In the present invention, R$^{4'''}$ preferably has a group represented by formula X-Q$^1$- as a substituent. In this case, R$^{4'''}$ is preferably a group represented by formula X-Q$^1$-Y$^1$— (in the formula, Q$^1$ and X are the same as defined above; and Y$^1$ represents an alkylene group of 1 to 4 carbon atoms which may have a substituent, or a fluorinated alkylene group of 1 to 4 carbon atoms which may have a substituent).

In the group represented by the formula X-Q$^1$-Y$^1$—, as the alkylene group for Y$^1$, the same alkylene group as those described above for Q$^1$ in which the number of carbon atoms is 1 to 4 can be used.

As the fluorinated alkylene group for Y$^1$, groups in which part of or all of the hydrogen atoms in the alkylene group are substituted with fluorine atoms can be used.

Specific examples of Y$^1$ include —CF$_2$—, —CF$_2$CF$_2$—, —CF$_2$CF$_2$CF$_2$—, —CF(CF$_3$)CF$_2$—, —CF(CF$_2$CF$_3$)—, —C(CF$_3$)$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, —CF(CF$_2$CF$_3$)CF$_2$—, —CF(CF$_2$CF$_2$CF$_3$)—, and —C(CF$_3$)(CF$_2$CF$_3$)—; —CHF—, —CH$_2$CF$_2$—, —CH$_2$CH$_2$CF$_2$—, —CH$_2$CF$_2$CF$_2$—, —CH(CF$_3$)CH$_2$—, —CH(CF$_2$CF$_3$)—, —C(CH$_3$)(CF$_3$)—, —CH$_2$CH$_2$CH$_2$CF$_2$—, —CH$_2$CH$_2$CF$_2$CF$_2$—, —CH(CF$_3$)CH$_2$CH$_2$—, —CH$_2$CH(CF$_3$)CH$_2$—, —CH(CF$_3$)CH(CF$_3$)—, and —C(CF$_3$)$_2$CH$_2$—; and —CH$_2$—, —CH$_2$CH$_2$—, —CH$_2$CH$_2$CH$_2$—, —CH(CH$_3$)CH$_2$—, —CH(CH$_2$CH$_3$)—, —C(CH$_3$)$_2$—, —CH$_2$CH$_2$CH$_2$CH$_2$—, —CH(CH$_3$)CH$_2$CH$_2$—, —CH$_2$CH(CH$_3$)CH$_2$—, —CH(CH$_3$)CH(CH$_3$)—, —C(CH$_3$)$_2$CH$_2$—, —CH(CH$_2$CH$_3$)CH$_2$—, —CH(CH$_2$CH$_2$CH$_3$)—, and —C(CH$_3$)(CH$_2$CH$_3$)—.

Y$^1$ is preferably a fluorinated alkylene group, and particularly preferably a fluorinated alkylene group in which the carbon atom bonded to the adjacent sulfur atom is fluorinated. Examples of such fluorinated alkylene groups include —CF$_2$—, —CF$_2$CF$_2$—, —CF$_2$CF$_2$CF$_2$—, —CF(CF$_3$)CF$_2$—, —CF$_2$CF$_2$CF$_2$CF$_2$—, —CF(CF$_3$)CF$_2$CF$_2$—, —CF$_2$CF(CF$_3$)CF$_2$—, —CF(CF$_3$)CF(CF$_3$)—, —C(CF$_3$)$_2$CF$_2$—, and —CF(CF$_2$CF$_3$)CF$_2$—; —CH$_2$CF$_2$—, —CH$_2$CH$_2$CF$_2$—, and —CH$_2$CF$_2$CF$_2$—; and —CH$_2$CH$_2$CH$_2$CF$_2$—, —CH$_2$CH$_2$CF$_2$CF$_2$—, and —CH$_2$CF$_2$CF$_2$CF$_2$—.

Of these, —CF$_2$—, —CF$_2$CF$_2$—, —CF$_2$CF$_2$CF$_2$—, or —CH$_2$CF$_2$CF$_2$— is preferable, more preferably —CF$_2$—, —CF$_2$CF$_2$—, or —CF$_2$CF$_2$CF$_2$—, and —CF$_2$— is particularly desirable.

The alkylene group or fluorinated alkylene group for Y$^1$ may have a substituent. The alkylene group or fluorinated alkylene group "has a substituent" means that part or all of the hydrogen atoms or fluorine atoms in the alkylene group or fluorinated alkylene group have been substituted with atoms or groups other than hydrogen atoms and fluorine atoms.

Examples of substituents which the alkylene group or fluorinated alkylene group may have include an alkyl group of 1 to 4 carbon atoms, an alkoxy group of 1 to 4 carbon atoms, and a hydroxyl group.

In formula (b-2), R$^{5'''}$ and R$^{6'''}$ each independently represents an aryl group or an alkyl group. At least one of R$^{5'''}$ and R$^{6'''}$ represents an aryl group. It is preferable that both of R$^{5'''}$ and R$^{6'''}$ represent an aryl group.

As the aryl group for R$^{5'''}$ and R$^{6'''}$, the same aryl groups as those for R$^{1'''}$ to R$^{3'''}$ can be used.

As the alkyl group for R$^{5'''}$ and R$^{6'''}$, the same alkyl groups as those for R$^{1'''}$ to R$^{3'''}$ can be used.

It is particularly desirable that both of R$^{5'''}$ and R$^{6'''}$ represent a phenyl group.

As R$^{4'''}$ in formula (b-2), the same as those mentioned above for R$^{4'''}$ in formula (b-1) can be used.

Specific examples of suitable onium salt-based acid generators represented by formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate;

triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; 1-phenyltetrahydrothiophenium trifluoromethanesulfonate, heptafluoropropanesulfonate or nonafluorobutanesulfonate; 1-(4-methylphenyl)tetrahydrothiophenium trifluoromethanesulfonate, heptafluoropropanesulfonate or nonafluorobutanesulfonate; 1-(3,5-dimethyl-4-hydroxyphenyl)tetrahydrothiophenium trifluoromethanesulfonate, heptafluoropropanesulfonate or nonafluorobutanesulfonate; 1-(4-methoxynaphthalene-1-yl)tetrahydrothiophenium trifluoromethanesulfonate, heptafluoropropanesulfonate or nonafluorobutanesulfonate; 1-(4-ethoxynaphthalene-1-yl)tetrahydrothiophenium trifluoromethanesulfonate, heptafluoropropanesulfonate or nonafluorobutanesulfonate; 1-(4-n-butoxynaphthalene-1-yl)tetrahydrothiophenium trifluoromethanesulfonate, heptafluoropropanesulfonate or nonafluorobutanesulfonate; 1-phenyltetrahydrothiopyranium trifluoromethanesulfonate, heptafluoropropanesulfonate or nonafluorobutanesulfonate; 1-(4-hydroxyphenyl)tetrahydrothiopyranium trifluoromethanesulfonate, heptafluoropropanesulfonate or nonafluorobutanesulfonate; 1-(3,5-dimethyl-4-hydroxyphenyl)tetrahydrothiopyranium trifluoromethanesulfonate, heptafluoropropanesulfonate or nonafluorobutanesulfonate; and 1-(4-methylphenyl)tetrahydrothiopyranium trifluoromethanesulfonate, heptafluoropropanesulfonate or nonafluorobutanesulfonate.

It is also possible to use onium salts in which the anion moiety of these onium salts is replaced by alkylsulfonates such as methanesulfonate, n-propanesulfonate, n-butanesulfonate, or n-octanesulfonate.

Furthermore, onium salts in which the anion moiety of these onium salts is replaced by an anion moiety represented by any one of formulas (b1) to (b8) shown below can also be used.

[Chemical Formula 20]

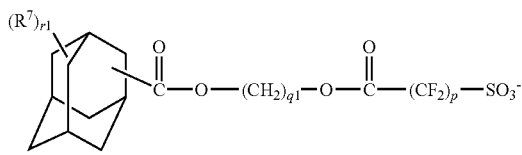

(b1)

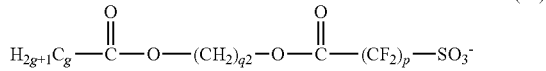

(b2)

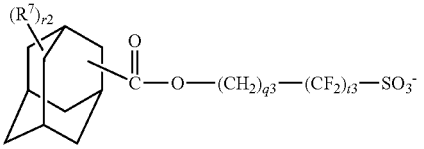

(b3)

wherein p represents an integer of 1 to 3; each of q1 and q2 independently represents an integer of 1 to 5; q3 represents an integer of 1 to 12; each of r1 and r2 independently represents an integer of 0 to 3; g represents an integer of 1 to 20; t3 represents an integer of 1 to 3; and $R^7$ represents a substituent.

[Chemical Formula 21]

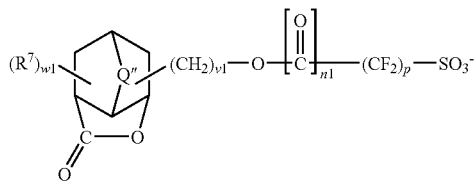

(b4)

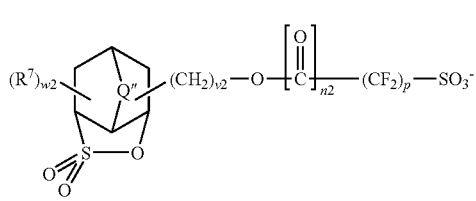

(b5)

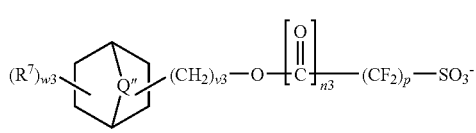

(b6)

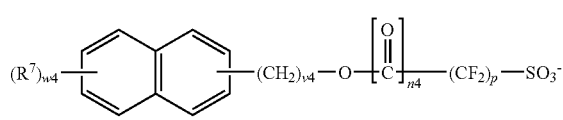

(b7)

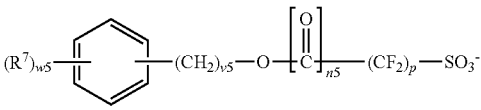

(b8)

wherein, p, $R^7$, and Q" are as defined above; each of n1 to n5 independently represents 0 or 1; each of v1 to v5 independently represents an integer of 0 to 3; and each of w1 to w5 independently represents an integer of 0 to 3.

As the substituent for $R^7$, the same groups as those which the aforementioned aliphatic hydrocarbon group or aromatic hydrocarbon group for X may have as a substituent can be used.

When the subscripts attached at the bottom right of $R^7$ (namely, w1 to w5) represent an integer of 2 or more, the plurality of $R^7$ groups in the compound may be the same or different from each other.

Each of r1 to r2 and w1 to w5 is preferably an integer of 0 to 2, and more preferably 0 or 1.

t3 is preferably 1 or 2, and is most preferably 1.

q3 is preferably 1 to 5, more preferably 1 to 3, and most preferably 1.

Further, onium salt-based acid generators in which the anion moiety in general formula (b-1) or (b-2) is replaced by an anion moiety represented by general formula (b-3) or (b-4) shown below (the cation moiety is the same as (b-1) or (b-2)) may also be used.

[Chemical Formula 22]

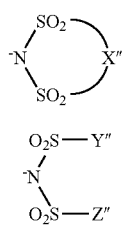

(b-3)

(b-4)

wherein X" represents an alkylene group of 2 to 6 carbon atoms in which at least one hydrogen atom has been substituted with a fluorine atom; and Y" and Z" each independently represents an alkyl group of 1 to 10 carbon atoms in which at least one hydrogen atom has been substituted with a fluorine atom.

X" represents a linear or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" each independently represents a linear or branched alkyl group in which at least one hydrogen atom has been substituted with a fluorine atom, and the alkyl group has 1 to 10 carbon atoms, preferably 1 to 7 carbon atoms, and more preferably 1 to 3 carbon atoms.

The smaller the number of carbon atoms of the alkylene group for X" or those of the alkyl group for Y" and Z" within the above-mentioned range of the number of carbon atoms, the more preferable since the solubility in a resist solvent is improved.

Further, in the alkylene group for X" or the alkyl group for Y" and Z", it is preferable that the number of hydrogen atoms substituted with fluorine atoms be as large as possible because the acid strength increases and the transparency to high energy radiation of 200 nm or less or electron beam is improved. The percentage of the fluorine atoms within the alkylene group or alkyl group, i.e., the fluorination ratio, is preferably from 70 to 100%, more preferably from 90 to 100%, and it is particularly desirable that the alkylene group or alkyl group be a perfluoroalkylene group or perfluoroalkyl group in which all hydrogen atoms are substituted with fluorine atoms.

Furthermore, as an onium salt-based acid generator, a sulfonium salt having a cation moiety represented by general formula (b-5) or (b-6) shown below may be used.

[Chemical Formula 23]

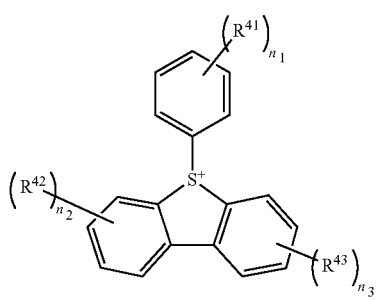

(b-5)

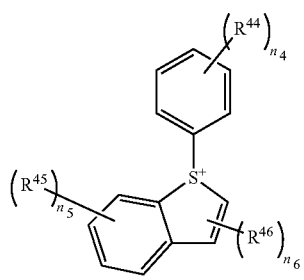

(b-6)

wherein $R^{41}$ to $R^{46}$ each independently represents an alkyl group, an acetyl group, an alkoxy group, a carboxyl group, a hydroxyl group or a hydroxyalkyl group; $n_1$ to $n_5$ each independently represents an integer of 0 to 3; and $n_6$ represents an integer of 0 to 2.

With respect to $R^{41}$ to $R^{46}$, the alkyl group is preferably an alkyl group of 1 to 5 carbon atoms, more preferably a linear or branched alkyl group, and most preferably a methyl group, an ethyl group, a propyl group, an isopropyl group, an n-butyl group or a tert-butyl group.

The alkoxy group is preferably an alkoxy group of 1 to 5 carbon atoms, more preferably a linear or branched alkoxy group, and most preferably a methoxy group or an ethoxy group.

The hydroxyalkyl group is preferably an aforementioned alkyl group in which one or more hydrogen atoms have been substituted with hydroxy groups, and examples thereof include a hydroxymethyl group, a hydroxyethyl group and a hydroxypropyl group.

When the subscripts $n_1$ to $n_6$ of $R^{41}$ to $R^{46}$ represent an integer of 2 or more, the plurality of $R^{41}$ to $R^{46}$ may be the same or different from each other.

$n_1$ is preferably 0 to 2, more preferably 0 or 1, and still more preferably 0.

It is preferable that $n_2$ and $n_3$ each independently represents 0 or 1, and more preferably 0.

$n_4$ is preferably 0 to 2, and more preferably 0 or 1.

$n_5$ is preferably 0 or 1, and more preferably 0.

$n_6$ is preferably 0 or 1, and more preferably 1.

The anion moiety of the sulfonium salt having a cation moiety represented by general formula (b-5) or (b-6) is not particularly limited, and the same anion moieties as those used within previously proposed onium salt-based acid generators may be used. Examples of such anion moieties include fluorinated alkylsulfonate ions such as anion moieties ($R^{4''}SO_3^-$) for onium salt-based acid generators represented by general formula (b-1) or (b-2) shown above; and anion moieties represented by general formula (b-3) or (b-4) shown above. Among these, a fluorinated alkylsufonate ion is preferable, a fluorinated alkylsufonate ion of 1 to 4 carbon atoms is more preferable, and a linear perfluoroalkylsulfonate ion of 1 to 4 carbon atoms is particularly desirable. Specific examples thereof include a trifluoromethylsulfonate ion, a heptafluoro-n-propylsulfonate ion and a nonafluoro-n-butylsulfonate ion.

In the present description, an oximesulfonate-based acid generator is a compound having at least one group represented by general formula (B-1) shown below, and has a feature of generating acid by irradiation. Such oximesulfonate-based acid generators are widely used for a chemically amplified resist composition, and can be appropriately selected.

[Chemical Formula 24]

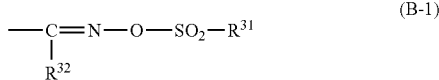

(B-1)

wherein $R^{31}$ and $R^{32}$ each independently represents an organic group.

The organic group for $R^{31}$ and $R^{32}$ refers to a group containing a carbon atom, and may include atoms other than carbon atoms (e.g., a hydrogen atom, an oxygen atom, a nitrogen atom, a sulfur atom, a halogen atom (such as a fluorine atom and a chlorine atom) and the like).

As the organic group for $R^{31}$, a linear, branched, or cyclic alkyl group or an aryl group is preferable. The alkyl group or the aryl group may have a substituent. The substituent is not particularly limited, and examples thereof include a fluorine atom and a linear, branched, or cyclic alkyl group having 1 to 6 carbon atoms. The expression "having a substituent" means that some or all of the hydrogen atoms of the alkyl group or the aryl group are substituted with substituents.

The alkyl group as the organic group for $R^{31}$ preferably has 1 to 20 carbon atoms, more preferably 1 to 10 carbon atoms, still more preferably 1 to 8 carbon atoms, still more preferably 1 to 6 carbon atoms, and most preferably 1 to 4 carbon atoms. As the alkyl group, a partially or completely halogenated alkyl group (hereinafter, sometimes referred to as a "halogenated alkyl group") is particularly desirable. The "partially halogenated alkyl group" refers to an alkyl group in which some of the hydrogen atoms are substituted with halogen atoms, and the "completely halogenated alkyl group" refers to an alkyl group in which all of the hydrogen atoms are substituted with halogen atoms. Examples of the halogen atom include a fluorine atom, a chlorine atom, a bromine atom and an iodine atom, and a fluorine atom is particularly desirable. In other words, the halogenated alkyl group is preferably a fluorinated alkyl group.

The aryl group as the organic group for $R^{31}$ preferably has 4 to 20 carbon atoms, more preferably 4 to 10 carbon atoms, and most preferably 6 to 10 carbon atoms. As the aryl group, partially or completely halogenated aryl group is particularly desirable. The "partially halogenated aryl group" refers to an aryl group in which some of the hydrogen atoms are substituted with halogen atoms, and the "completely halogenated aryl group" refers to an aryl group in which all of hydrogen atoms are substituted with halogen atoms.

As $R^{31}$, an alkyl group of 1 to 4 carbon atoms which has no substituent or a fluorinated alkyl group of 1 to 4 carbon atoms is particularly desirable.

As the organic group for $R^{32}$, a linear, branched, or cyclic alkyl group, an aryl group, or a cyano group is preferable. Examples of the alkyl group and the aryl group for $R^{32}$ include the same as those of the alkyl group and the aryl group for $R^{31}$.

As $R^{32}$, a cyano group, an alkyl group of 1 to 8 carbon atoms having no substituent or a fluorinated alkyl group of 1 to 8 carbon atoms is particularly desirable.

Preferred examples of the oxime sulfonate-based acid generator include compounds represented by general formula (B-2) or (B-3) shown below.

[Chemical Formula 25]

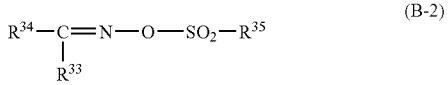

(B-2)

wherein $R^{33}$ represents a cyano group, an alkyl group having no substituent or a halogenated alkyl group; $R^{34}$ represents an aryl group; and $R^{35}$ represents an alkyl group having no substituent or a halogenated alkyl group.

[Chemical Formula 26]

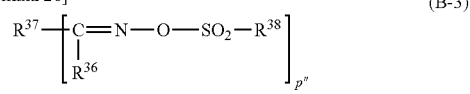

(B-3)

wherein $R^{36}$ represents a cyano group, an alkyl group having no substituent or a halogenated alkyl group; $R^{37}$ represents a divalent or trivalent aromatic hydrocarbon group; $R^{38}$ represents an alkyl group having no substituent or a halogenated alkyl group; and p" represents 2 or 3.

In general formula (B-2) above, the alkyl group having no substituent or the halogenated alkyl group for $R^{33}$ preferably has 1 to 10 carbon atoms, more preferably 1 to 8 carbon atoms, and most preferably 1 to 6 carbon atoms.

As $R^{33}$, a halogenated alkyl group is preferable, and a fluorinated alkyl group is more preferable.

The fluorinated alkyl group for $R^{33}$ is preferably an alkyl group in which 50% or more of the hydrogen atoms have been fluorinated, more preferably an alkyl group in which 70% or more of the hydrogen atoms have been fluorinated, and most preferably an alkyl group in which 90% or more of the hydrogen atoms have been fluorinated.

Examples of the aryl group for $R^{34}$ include groups in which one hydrogen atom has been removed from an aromatic hydrocarbon ring, such as a phenyl group, a biphenyl group, a fluorenyl group, a naphthyl group, an anthryl group, and a phenanthryl group; and heteroaryl groups in which some of the carbon atoms constituting the ring(s) of these groups are substituted with hetero atoms such as an oxygen atom, a sulfur atom, and a nitrogen atom. Of these, a fluorenyl group is preferable.

The aryl group for $R^{34}$ may have a substituent such as an alkyl group of 1 to 10 carbon atoms, a halogenated alkyl group, or an alkoxy group. The alkyl group and halogenated alkyl group as the substituent preferably has 1 to 8 carbon atoms, and more preferably 1 to 4 carbon atoms. The halogenated alkyl group is preferably a fluorinated alkyl group.

The alkyl group having no substituent or the halogenated alkyl group for $R^{35}$ preferably has 1 to 10 carbon atoms, more preferably 1 to 8 carbon atoms, and most preferably 1 to 6 carbon atoms.

As $R^{35}$, a halogenated alkyl group is preferable, and a fluorinated alkyl group is more preferable.

In terms of enhancing the strength of the acid generated, the fluorinated alkyl group for $R^{35}$ is preferably an alkyl group in which 50% or more of the hydrogen atoms have been fluorinated, more preferably an alkyl group in which 70% or more of the hydrogen atoms have been fluorinated, and still more preferably an alkyl group in which 90% or more of the hydrogen atoms have been fluorinated. A completely fluorinated alkyl group in which 100% of the hydrogen atoms are substituted with fluorine atoms is particularly desirable.

In general formula (B-3) above, the alkyl group having no substituent and the halogenated alkyl group for $R^{36}$ are the same as the alkyl group having no substituent and the halogenated alkyl group for $R^{33}$.

Examples of the divalent or trivalent aromatic hydrocarbon group for $R^{37}$ include groups in which one or two hydrogen atoms have been further removed from the aryl group for $R^{34}$.

Examples of the alkyl group having no substituent or the halogenated alkyl group for $R^{38}$ include the same as the alkyl group having no substituent or the halogenated alkyl group for $R^{35}$.

p" is preferably 2.

Specific examples of suitable oxime sulfonate-based acid generators include α-(p-toluenesulfonyloxyimino)-benzyl cyanide, α-(p-chlorobenzenesulfonyloxyimino)-benzyl cyanide, α-(4-nitrobenzenesulfonyloxyimino)-benzyl cyanide, α-(4-nitro-2-trifluoromethylbenzenesulfonyloxyimino)-benzyl cyanide, α-(benzenesulfonyloxyimino)-4-chlorobenzyl cyanide, α-(benzenesulfonyloxyimino)-2,4-dichlorobenzyl cyanide, α-(benzenesulfonyloxyimino)-2,6-dichlorobenzyl cyanide, α-(benzenesulfonyloxyimino)-4-methoxybenzyl cyanide, α-(2-chlorobenzenesulfonyloxyimino)-4-methoxybenzyl cyanide, α-(benzenesulfonyloxyimino)-thien-2-yl acetonitrile, α-(4-dodecylbenzenesulfonyloxyimino)benzyl cyanide, α-[(p-toluenesulfonyloxyimino)-4-methoxyphenyl]acetonitrile, α-[(dodecylbenzenesulfonyloxyimino)-4-methoxyphenyl]acetonitrile, α-(tosyloxyimino)-4-thienyl cyanide, α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino)-cyclohexyl acetonitrile, α-(ethylsulfonyloxyimino)-ethyl acetonitrile, α-(propylsulfonyloxyimino)-propyl acetonitrile, α-(cyclohexylsulfonyloxyimino)-cyclopentyl acetonitrile, α-(cyclohexylsulfonyloxyimino)-cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile, α-(n-butylsulfonyloxyimino)-1-cyclohexenyl acetonitrile, α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile.

Further, oxime sulfonate-based acid generators disclosed in Japanese Unexamined Patent Application, First Publication No. Hei 9-208554 (Chemical Formulas 18 and 19 shown in paragraphs [0012] to [0014]) and oxime sulfonate-based acid generators disclosed in WO 2004/074242A2 (Examples 1 to 40 described at pages 65 to 85) may be preferably used.

Furthermore, the following can also be mentioned as preferable examples.

[Chemical Formula 27]

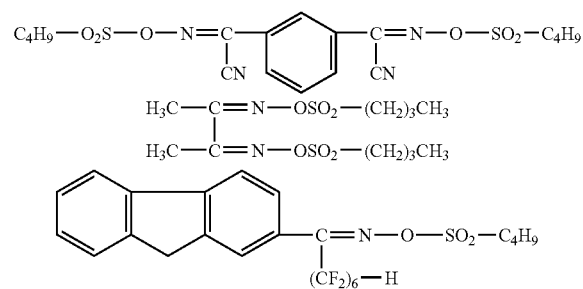

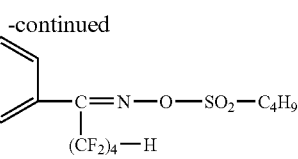

Of the aforementioned diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, diazomethane-based acid generators disclosed in Japanese Unexamined Patent Application, First Publication No. Hei 11-035551, Japanese Unexamined Patent Application, First Publication No. Hei 11-035552 and Japanese Unexamined Patent Application, First Publication No. Hei 11-035573 may be preferably used.

Furthermore, as poly(bis-sulfonyl)diazomethanes, those disclosed in Japanese Unexamined Patent Application, First Publication No. Hei 11-322707, including 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, may be used.

As the component (B), one type of these acid generators may be used alone, or two or more types may be used in combination.

In the present invention, as the component (B), it is preferable to use an onium salt-based acid generator which contains a fluorinated alkylsulfonate ion that may have a substituent or an anion moiety represented by general formula (b-3) above.

The amount of the component (B) within the positive resist composition of the present invention is preferably from 0.5 to 50 parts by weight, and more preferably from 1 to 40 parts by weight, relative to 100 parts by weight of the component (A). When the amount of the component (B) is within the above-mentioned range, formation of a resist pattern can be satisfactorily performed. Further, by virtue of the above-mentioned range, a uniform solution can be obtained and the storage stability becomes satisfactory.

<Optional Component>

In order to improve factors such as the resist pattern shape and the post exposure stability of the latent image formed by the pattern-wise exposure of the resist layer, the positive resist composition of the present invention may further include a nitrogen-containing organic compound (D) (hereafter referred to as "component (D)") as an optional component.

A multitude of these components (D) have already been proposed, and any of these known compounds may be used, although an aliphatic amine, and particularly a secondary aliphatic amine or tertiary aliphatic amine is preferable. Here, an "aliphatic amine" means an amine having one or more aliphatic groups, and the aliphatic groups preferably have 1 to 20 carbon atoms.

Examples of these aliphatic amines include amines in which at least one hydrogen atom of ammonia ($NH_3$) has been substituted with an alkyl group or hydroxyalkyl group of no more than 20 carbon atoms (that is, alkylamines or alkyl alcohol amines), and cyclic amines.

Specific examples of the alkylamines or alkyl alcohol amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, tri-n-octanolamine, stearyl diethanolamine and lauryl diethanolamine. Among these, trialkylamines and/or alkyl alcohol amines are preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris {2-(1-methoxyethoxy)ethyl}amine, tris{2-(1-ethoxyethoxy)ethyl}amine, tris{2-(1-ethoxypropoxy)ethyl}amine, and tris[2-{2-(2-hydroxyethoxy)ethoxy}ethyl]amine.

Also, as the component (D), an aromatic amine can be used. Examples of aromatic amines include aniline, pyridine, 4-dimethylaminopyridine, pyrrole, indole, pyrazole, imidazole and derivatives thereof, diphenylamine, triphenylamine and tribenzylamine.

Of these, one type may be used alone, or two or more types may be used in combination.

The component (D) is typically used in an amount within a range from 0.01 to 5.0 parts by weight, relative to 100 parts by weight of the component (A).

Furthermore, in the positive resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of organic carboxylic acids and phosphorus oxo acids and derivatives thereof can be added as an optional component.

Examples of suitable organic carboxylic acids include acetic acid, malonic acid, citric acid, malic acid, succinic acid, benzoic acid, and salicylic acid.

Examples of phosphorus oxo acids and derivatives thereof include phosphoric acid, phosphonic acid and phosphinic acid. Among these, phosphonic acid is particularly desirable.

Examples of phosphorus oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters such as phenylphosphinic acid.

As the component (E), one type of component may be used alone, or two or more types may be used in combination.

The component (E) is typically used in an amount within a range from 0.01 to 5.0 parts by weight, relative to 100 parts by weight of the component (A).

If desired, other miscible additives can also be added to the positive resist composition of the present invention. Examples of such miscible additives include additive resins for improving the performance of the resist film, surfactants for improving the applicability, dissolution inhibitors, plasticizers, stabilizers, colorants, halation prevention agents, and dyes.

<Organic Solvent>

The positive resist composition of the present invention can be prepared by dissolving the materials for the resist composition in an organic solvent (hereafter, frequently referred to as "component (S)").

The component (S) may be any organic solvent which can dissolve the respective components to give a uniform solution, and any one or more kinds of organic solvents can be appropriately selected from those which have been conventionally known as solvents for a chemically amplified resist.

Examples thereof include lactones such as γ-butyrolactone; ketones such as acetone, methyl ethyl ketone, cyclohexanone, methyl-n-pentyl ketone, methyl isopentyl ketone and 2-heptanone; polyhydric alcohols such as ethylene glycol, diethylene glycol, propylene glycol and dipropylene glycol; polyhydric alcohol derivatives including compounds having an ester bond, such as ethylene glycol monoacetate, diethylene glycol monoacetate, propylene glycol monoacetate and dipropylene glycol monoacetate, and compounds having an ether bond, such as a monoalkyl ether (such as a monomethyl ether, monoethyl ether, monopropyl ether or monobutyl ether) or a monophenyl ether of any of the above polyhydric alcohols or compounds having an ester bond [among these derivatives, propylene glycol monomethyl ether acetate (PGMEA) and propylene glycol monomethyl ether (PGME) are preferred]; cyclic ethers such as dioxane; esters such as methyl lactate, ethyl lactate (EL), methyl acetate, ethyl acetate, butyl acetate, methyl pyruvate, ethyl pyruvate, methyl methoxypropionate and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene and mesitylene.

These solvents can be used individually, or as a mixed solvent containing two or more different solvents.

Among these, propylene glycol monomethyl ether acetate (PGMEA), propylene glycol monomethyl ether (PGME) and ethyl lactate (EL) are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in a range from 1:9 to 9:1, and more preferably from 2:8 to 8:2.

Specifically, when EL is mixed as the polar solvent, the PGMEA:EL weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably from 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) used is not particularly limited, and is appropriately adjusted to a concentration which enables coating of a coating solution to a substrate, depending on the thickness of the coating film. In general, the component (S) is used in an amount such that the solid content of the resist composition becomes within the range from 1 to 20% by weight, and preferably from 2 to 15% by weight.

The compound (A1) described above as well as the positive resist composition of the present invention containing the compound (A1) are novel, which have been unknown until now.

Further, according to the present invention, a high resolution resist pattern such as an ultra fine resist pattern with pattern dimensions of 200 nm or less, or even down to several tens of nanometers, can be formed.

Furthermore, according to the present invention, a resist pattern having an excellent shape with reduced levels of roughness and footing can be formed. Such effects become especially marked, as the resist pattern to be formed is miniaturized. "Footing" is a phenomenon that occurs when a resist pattern is formed using a positive resist composition in which a portion of the resist film in exposed portions remains undissolved at the substrate interface, thereby causing the cross sectional shape of the formed resist pattern to result in a shape in which the bases of the pattern tend to spread out. The problem of footing tends to occur especially when a substrate is used in which the surface that comes into contact with the resist film is constituted of an inorganic material, namely an inorganic substrate.

Further, according to the present invention, an exposure margin is also improved. The exposure margin is the range of the exposure dose at which a resist pattern can be formed with a size within a predetermined range of variation from a target size, when exposure is conducted by changing the exposure dose, i.e., the range of the exposure dose at which a resist pattern faithful to the mask pattern can be formed. The larger the exposure margin (EL margin), the smaller the variation in the pattern size depending on the change in the exposure dose, thereby resulting in favorable improvement in the process margin.

Furthermore, according to the present invention, the level of defects can also be reduced. Here, the term "defects" refers to general abnormalities detected by inspection of the developed resist pattern from directly above the resist pattern, using a surface defect detection device (trade name: "KLA") manufactured by KLA-TENCOR Corporation. Examples of these abnormalities include post-developing scum, foam, dust, bridges across different portions of the resist pattern, color irregularities, and foreign deposits.

The reason why the above effects are achieved is not entirely clear, but it is thought that because the compound (A1) includes four triphenylmethane structures and a tetravalent linking moiety that links the four triphenylmethane structures, the heat resistance of the compound (A1) is improved.

By having such a structure as described above, the compound (A1) exhibits high heat resistance, for example, a heat resistance as high as that of a polymer. Therefore, when forming a resist pattern, heat sag of the resist film is unlikely to occur during post exposure baking (PEB), and hence the diffusion of acid generated in exposed regions to unexposed regions can be suppressed. As a result, the difference in the solubility within the alkali developing solution of the unexposed portions and the exposed portions (namely, the solubility contrast) is improved, and it is presumed that resolution and resist pattern shapes can be improved.

Furthermore, the fact that the compound (A1) is a low molecular weight non-polymer with highly uniform properties is also considered to be one of the possible reasons. In other words, in conventional resists that use a high molecular weight polymer (resin) as the base material component of the resist material, controlling the molecular weight dispersion and the alkali solubility dispersion is very difficult. As a result, there is a limit to the degree of reduction that can be achieved in the LER, which is caused by factors such as these dispersions, and the molecular size itself Furthermore, in the case of conventional low molecular weight compounds (low molecular materials) that have been considered for countering the above problems, because the alkali-soluble groups are protected with acid dissociable, dissolution inhibiting groups as described in the above Non-Patent Documents 1 and 2, variations occur between individual molecules in terms of the positions of the protected alkali-soluble groups and the protection ratio, and as a result, variations also develop in the properties of the compound, causing similar problems to those outlined above.

In contrast, the compound (A1) is a low molecular weight non-polymer, and also has a structure in which an acid dissociable, dissolution inhibiting group is introduced to the phenolic compound (I) having phenolic hydroxyl groups which are bonded to the triphenylmethane structure as the —OH groups. In the phenolic compound (I), when acid dissociable, dissolution inhibiting groups are introduced to the —OH groups for protection, selectivity for the positions of the protected —OH groups is relatively high. As a result, the resulting compound exhibits minimal variation in structure and molecular weight, and thus exhibits minimal variation between molecules in terms of properties such as the solubility in an alkali developing solution, the hydrophilicity, and the hydrophobicity. In particular, when the compound (A1) includes carboxyl hydroxyl groups, since the carboxyl hydroxyl groups that are more reactive than the phenolic hydroxyl groups tend to undergo selective protection, the aforementioned types of variation within the compound is extremely small. Accordingly, it is surmised that by using the compound (A1), a resist film with uniform properties can be formed, and that as a result, the effects described above can be achieved.

Furthermore, because acid dissociable, dissolution inhibiting groups can be introduced to the selected positions within the phenolic compound (I), there is also an advantage in that the overall properties of the compound (A) can be easily controlled by appropriate selection of the acid dissociable, dissolution inhibiting group. For example, if a comparison is made among a case where a group having a polycyclic structure such as an adamantane ring is selected as the acid dissociable, dissolution inhibiting group, a case where a group having a monocyclic structure such as a cyclohexane ring is selected, and a case where a group having a chain-like structure is selected, then the solubility of the compound (A1) in an alkali developing solution satisfies the following expression: "group having a polycyclic structure<group having a monocyclic structure<group having a chain-like structure".

<<Method of Forming a Resist Pattern>>

The method of forming a resist pattern according to the present invention includes: applying a positive resist composition of the present invention to a substrate to form a resist film on the substrate; exposing the resist film; and developing the resist film to form a resist pattern.

More specifically, the method for forming a resist pattern according to the present invention can be performed, for example, as follows.

Firstly, the resist composition according to the present invention is applied onto a substrate using a spinner or the like, and a prebake (post applied bake (PAB)) is conducted under temperature conditions of 80 to 150° C. for 40 to 120 seconds, preferably 60 to 90 seconds to form a resist film. Following selective exposure of the formed resist film, either by exposure through a mask pattern using an exposure apparatus such as an ArF exposure apparatus, an electron beam lithography apparatus or an EUV exposure apparatus, or by patterning via direct irradiation with an electron beam without using a mask pattern, post exposure baking (PEB) is conducted under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, bake treatment (post bake) can be conducted following the developing. In this manner, a resist pattern that is faithful to the mask pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) can be used.

The wavelength to be used for exposure is not particularly limited and the exposure can be conducted using radiations such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV, and particularly effective to ArF excimer laser.

Exposure of the resist film may be conducted either by normal exposure within the air or an inert gas such as nitrogen (dry exposure), or by liquid immersion exposure.

<<Dissolution Inhibitor>>

The compound (A1) described above can also be used favorably as a dissolution inhibitor for a positive resist composition. By using a dissolution inhibitor formed from the compound (A1), the alkali solubility (prior to exposure) of the resist film obtained using the positive resist composition containing the dissolution inhibitor is inhibited. As a result, when the resist film is selectively exposed, the difference in alkali solubility between the exposed portions and the unexposed portions (the solubility contrast) increases, and a resist pattern with favorable resolution and shape can be formed.

This dissolution inhibitor can be used by adding the dissolution inhibitor to a two-component chemically amplified resist composition including a resin component having acid dissociable, dissolution inhibiting groups, and an acid generator component. Furthermore, the dissolution inhibitor may also be used in a so-called three-component chemically amplified resist composition, which includes a resin component having no acid dissociable, dissolution inhibiting groups, an acid generator component, and the dissolution inhibitor.

EXAMPLES

As follows is a more detailed description of the present invention based on a series of examples, although the scope of the present invention is in no way limited by these examples.

Synthesis Example 1

Synthesis of 2,2-bis{4,4-bis(4-hydroxy-3-hydroxymethyl-5-methylphenyl)cyclohexyl}propane A 5 L four-necked flask was charged with 1,020.0 g (4.08 mol) of a 16% by weight aqueous solution of sodium hydroxide, and this reaction vessel was purged with nitrogen. Thereafter, 538.0 g (0.85 mol) of 2,2-bis{4,4-bis(4-hydroxy-5-methylphenyl)cyclohexyl}propane was further added thereto at a temperature of about 35° C., and the resulting mixture was then stirred for 1 hour. 947.1 g (11.05 mol) of a 35% by weight aqueous formaldehyde solution was then added to the mixture while stirring at 25 to 30° C. over a period of 2 hours to effect a reaction. Thereafter, a reaction was performed with stirring at 30° C. for a further 5 hours.

Following completion of the reaction, the reaction solution was cooled to 10° C., and 550.8 g of methyl ethyl ketone was added dropwise thereto over a period of 20 minutes, followed by the addition of 1280.0 g of methyl isobutyl ketone. Subsequently, the reaction system was neutralized using 661.8 g of a 17.5% by weight aqueous solution of hydrochloric acid, and the temperature was then raised to 30° C. Then the system was allowed to stand for 10 minutes, and a resulting water layer was removed from the system. Thereafter, a further 640.0 g of water was added to the system followed by stirring, and a resulting water layer was removed from the system. 1021.5 g of the solvent was then removed from the obtained oil layer at 45° C. by evaporation under reduced pressure, and 1280.0 g of toluene was then added to the resultant followed by cooling to precipitate crystals. The resulting crystals were isolated by filtration, yielding 870.2 g of crude crystals.

Thereafter, the obtained crude crystals, 960.0 g of methyl ethyl ketone, 1,700.0 g of methyl isobutyl ketone and 800 g of water were charged into a 5 L four-necked flask, and following dissolution of crystals by heating to 45° C., the system was allowed to stand, and a resulting water layer was then removed from the system. 1470.5 g of the solvent was then removed from the obtained oil layer at 45° C. by evaporation under reduced pressure (crystal precipitation began to occur in the midst of this process). The resultant was then cooled to 20° C., and the precipitate was filtered off and dried, yielding 224.8 g of a white powder of the target product (purity of 93.3%, which was determined by high performance liquid chromatography).

Synthesis Example 2

Synthesis of 2,2-bis{4,4-bis(3-formyl-4-hydroxy-5-methylphenyl)cyclohexyl}propane A 3 L four-necked flask was charged with 461.7 g (4.05 mol) of trifluoroacetic acid, and this reaction vessel was purged with nitrogen. Thereafter, 83.3 g (0.594 mol) of hexamethylenetetramine was added to the reaction system at a temperature of about 30° C., and then 101.7 g (0.135 mol) of the 2,2-bis{4,4-bis(4-hydroxy-3-hydroxymethyl-5-methylphenyl)cyclohexyl}propane (in a methylol form) obtained in Synthesis Example 1 was further added to the resulting mixture while stirring at 60° C. over a period of 1.5 hours to effect a reaction. Thereafter, a reaction was performed with stirring at 80° C. for a further 16 hours.

Following completion of the reaction, 251.5 g of water was added to the obtained reaction solution, and a hydrolysis reaction was performed at 60° C. for 1 hour. A viscous solid material precipitated during the hydrolysis. 201.2 g of toluene and 301.8 g of methyl isobutyl ketone were added to the resulting mixture, and following dissolution by heating to 70° C., the system was allowed to stand, and a resulting water layer was then removed from the system. Subsequently, the reaction system was neutralized using 444.8 g of a 16% by weight aqueous solution of sodium hydroxide, followed by cooling during which precipitation of crystals occurred. After the temperature was cooled to 20° C., the resulting precipitates were collected by filtration, yielding 104.0 g of crude crystals.

Thereafter, the obtained crude crystals and 1,814.0 g of tetrahydrofuran were charged into a 3 L four-necked flask, and following dissolution of crystals by heating to 60° C., 1,449.0 g of the solvent was then removed from the reaction system by evaporation under normal pressure. Crystal precipitation occurred in the midst of this process. 240.0 g of water and 144.0 g of acetone were added to the residual liquid, and the resultant was then cooled to 20° C., and the precipitate was filtered off and dried, yielding 71.2 g of a yellow powder of the targeted product (purity of 96.2%, which was determined by high performance liquid chromatography).

The results of proton nuclear magnetic resonance (NMR) spectral analysis (400 MHz, solvent: DMSO-d6) of the thus obtained yellow powder confirmed that the targeted compound had been obtained. The yield of the thus obtained yellow powder relative to the source material in a methylol form was 70.8%.

[Chemical Formula 28]

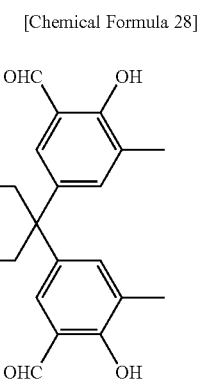

TABLE 1

$^1$H-NMR (400 MHz) identification results
(internal standard: tetramethylsilane)

| Shift value (ppm) | Number of protons | Signal | Assignment |
|---|---|---|---|
| 0.47 | 6 | s | —CH$_3$ (1) |
| 1.05-1.14 | 4 | m | —CH$_2$(cyclohexyl) |
| 1.38-1.43 | 2 | m | —CH(cyclohexyl) |

TABLE 1-continued $^1$H-NMR (400 MHz) identification results
(internal standard: tetramethylsilane)

| Shift value (ppm) | Number of protons | Signal | Assignment |
|---|---|---|---|
| 1.59-1.62 | 4 | m | —CH$_2$(cyclohexyl) |
| 1.74-1.77 | 4 | m | —CH$_2$(cyclohexyl) |
| 2.10-2.18 | 12 | m | —CH$_3$ (2) |
| 2.79-2.82 | 4 | m | —CH$_2$(cyclohexyl) |
| 7.34-7.69 | 8 | m | Ph-H |
| 9.97-10.06 | 4 | m | Ph-OH |
| 10.83-10.91 | 4 | m | —CHO |

Synthesis Example 3

Synthesis of 2,2-bis{4,4-bis(3-formyl-4-methoxycarbonylmethoxy-5-methylphenyl)cyclohexyl}propane A 500 mL four-necked flask was charged with 37.2 g (0.05 mol) of the 2,2-bis{4,4-bis(3-formyl-4-hydroxy-5-methylphenyl)cyclohexyl}propane obtained in Synthesis Example 2 and 111.6 g of N-methylpyrrolidone, and the inside of this flask was purged with nitrogen. After heating this mixture solution to 50° C., 5.6 g (0.034 mol) of potassium iodide and 33.1 g (0.24 mol) of potassium carbonate were further added thereto, and the resulting mixture was then stirred for 1 hour. Subsequently, the resulting mixture was then heated to 60° C., and 64.8 g (0.60 mol) of methyl chloroacetate was then added dropwise to the mixture while stirring over a period of 1 hour to effect a reaction. Thereafter, the reaction was continued with stirring at 60° C. for a further 3 hours.

Following completion of the reaction, 98.0 g of methyl isobutyl ketone and 147.0 g of water were added to the obtained reaction solution followed by stirring, the system was allowed to stand, and a resulting water layer was then removed from the system. Thereafter, a further 50.0 g of water was added to the obtained oil layer followed by stirring, and a resulting water layer was removed from the system. Thereafter, the same operation of washing with water followed by separation of the water layer was further conducted twice. The obtained oil layer was transferred to an evaporator, and the solvent was removed by evaporation at 60° C. under reduced pressure, yielding 43.7 g of a solid material in the form of a light yellow powder (purity of 89.0%, which was determined by high performance liquid chromatography).

The results of proton nuclear magnetic resonance (NMR) spectral analysis (400 MHz, solvent: DMSO-d6) of the thus obtained reaction product confirmed that the targeted product had been obtained.

The yield of the thus obtained reaction product relative to the source material, i.e., 2,2-bis{4,4-bis(3-formyl-4-hydroxy-5-methylphenyl)cyclohexyl}propane (in a tetraaldehyde form), was 84.5%.

[Chemical Formula 29]

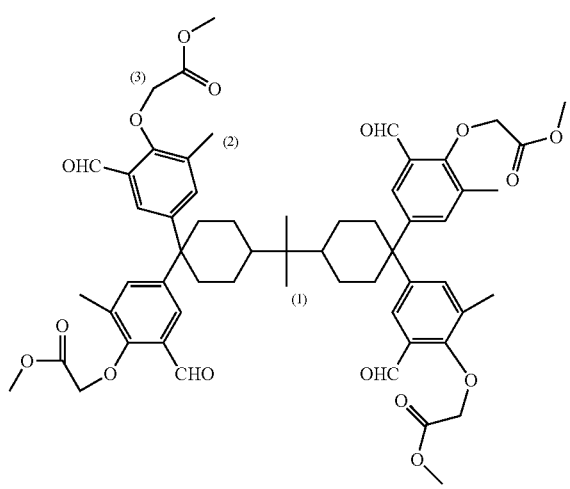

TABLE 2

$^1$H-NMR (400 MHz) identification results
(internal standard: tetramethylsilane)

| Shift value (ppm) | Number of protons | Signal | Assignment |
|---|---|---|---|
| 0.43 | 6 | s | —CH$_3$ (1) |
| 0.97-1.07 | 4 | m | —CH$_2$(cyclohexyl) |
| 1.35-1.41 | 2 | m | —CH(cyclohexyl) |
| 1.59-1.61 | 4 | m | —CH$_2$(cyclohexyl) |
| 1.74-1.81 | 4 | m | —CH$_2$(cyclohexyl) |
| 2.25-2.31 | 12 | m | —CH$_3$ (2) |
| 2.84-2.87 | 4 | m | —CH$_2$(cyclohexyl) |
| 3.67-3.68 | 12 | m | —OCH$_3$ |
| 4.70-4.75 | 8 | m | —CH$_2$ (3) |
| 7.47-7.65 | 8 | m | Ph-H |
| 10.32-10.38 | 4 | m | —CHO |

Synthesis Example 4

Synthesis of 2,2-bis[4,4-bis{3-bis(2,5-dimethyl-4-hydroxyphenyl)methyl-4-carboxymethoxy-5-methylphenyl}cyclohexyl]propane A 1 L four-necked flask was charged with 48.8 g (0.4 mol) of 2,5-xylenol and 73.2 g of methanol, the inside of this flask was purged with nitrogen, and 19.5 g of a 35% aqueous solution of hydrochloric acid was then added thereto. Subsequently, 39.1 g (0.04 mol) of the 2,2-bis{4,4-bis(3-formyl-4-methoxycarbonylmethoxy-5-methylphenyl)cyclohexyl}propane obtained in Synthesis Example 3 was added to the mixture at 40° C. while stirring over a period of 1.5 hours to effect a reaction. Thereafter, a reaction was performed with stirring at 50° C. for a further 17 hours.

Following completion of the reaction, the reaction system was neutralized using 68.6 g of a 25% by weight aqueous solution of tetramethylammonium hydroxide, 150.0 g of methyl isobutyl ketone and 75.0 g of water were added, the system was allowed to stand at 50° C., the water layer was removed, a further 75.0 g of water was added followed by stirring, and the same operation of washing with water followed by separation of the water layer was conducted. 174.7 g of a 25% by weight aqueous solution of tetramethylammonium hydroxide was then added to the obtained oil layer, and a hydrolysis reaction was performed at 50° C. for 1 hour with stirring. The system was then allowed to stand, and a resulting water layer was removed. After mixing the obtained water layer and 226.0 g of methyl isobutyl ketone at 50° C., the mixture was neutralized using 52.6 g of a 35% by weight aqueous solution of hydrochloric acid, and the system was allowed to stand, the water layer was removed, a further 100.0 g of water was added, and the same operation of washing with water followed by separation of the water layer was conducted at 70° C. The solvent was then removed from the obtained oil layer at 70° C. by evaporation under reduced pressure, and 75.0 g of acetone was then added and mixed with the resultant. The resulting solution was then added dropwise to 1,400 g of toluene at room temperature to form a precipitate. The precipitated solid material was filtered off and dried, yielding 62.4 g of a light yellow powder of the targeted product (purity of 87.7%, which was determined by high performance liquid chromatography).

The results of proton nuclear magnetic resonance (NMR) spectral analysis (400 MHz, solvent: DMSO-d6) of the thus obtained reaction product confirmed that the targeted product had been obtained.

The yield of the thus obtained reaction product relative to the source material, i.e., 2,2-bis{4,4-bis(3-formyl-4-methoxycarbonylmethoxy-5-methylphenyl)cyclohexyl}propane, was 87.3%.

Furthermore, the glass transition temperature of the thus obtained reaction product (determined by differential scanning calorimetry) was 204.9° C.

[Chemical Formula 30]

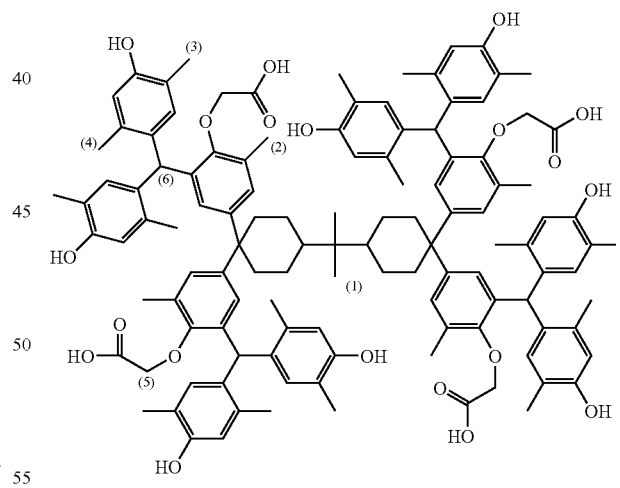

TABLE 3

$^1$H-NMR (400 MHz) identification results
(internal standard: tetramethylsilane)

| Shift value (ppm) | Number of protons | Signal | Assignment |
|---|---|---|---|
| 0.32 | 6 | s | —CH$_3$ (1) |
| 0.60 | 4 | s | —CH$_2$(cyclohexyl) |
| 1.03 | 2 | s | —CH(cyclohexyl) |

TABLE 3-continued $^1$H-NMR (400 MHz) identification results
(internal standard: tetramethylsilane)

| Shift value (ppm) | Number of protons | Signal | Assignment |
|---|---|---|---|
| 1.22 | 4 | s | —CH$_2$(cyclohexyl) |
| 1.48 | 4 | s | —CH$_2$(cyclohexyl) |
| 1.67-2.29 | 136 | m | —CH$_2$(cyclohexyl) + —CH$_3$ [(2) + (3) + (4)] |
| 3.82-3.85 | 8 | m | —CH$_2$ (5) |
| 5.79-5.80 | 4 | m | —CH (6) |
| 6.30-7.25 | 24 | m | Ph-H |
| 8.88 | 8 | s | Ph-OH |
| 12.73 | 4 | s | —COOH |

Synthesis Example 5

Synthesis of 2,2-bis[4,4-bis{3-bis(2,5-dimethyl-4-hydroxyphenyl)methyl-4-(2-methyl-2-adamantyl)oxycarbonylmethoxycarbonylmethoxy-5-methylphenyl}cyclohexyl]propane (compound (1) represented by formula (1) shown below)

A 1 L four-necked flask was charged with 18.1 g (1.5×10$^{-2}$ mol) of the 2,2-bis[4,4-bis{3-bis(2,5-dimethyl-4-hydroxyphenyl)methyl-4-carboxymethoxy-5-methylphenyl}cyclohexyl]propane obtained in Synthesis Example 4 and 45.3 g of N-methylpyrrolidone, the mixture was dissolved at 30° C., and the inside of this flask was purged with nitrogen. 7.3 g (7.2×10$^{-2}$ mol) of triethylamine was further added thereto at 35° C., and the resulting mixture was then stirred for 30 minutes. Subsequently, 19.4 g (6.75×10$^{-2}$ mol) of 2-methyl-2-adamantyl bromoacetate was added to the mixture at 35° C. while stirring over a period of 1 hour and 40 minutes to effect a reaction. Thereafter, the reaction was continued with stirring at 35° C. for a further 6 hours. Following completion of the reaction, 61.0 g of toluene and 30.0 g of water were added to the obtained reaction solution, the system was then allowed to stand, and a resulting lower layer (namely, water layer) was then removed from the system. Thereafter, a further 30.0 g of water was added to the obtained oil layer, and the same operation of washing with water followed by separation of the water layer (i.e., removal of the water layer) was repeated twice. The obtained oil layer was concentrated by removing the solvent therefrom under reduced pressure and was then purified by silica gel column chromatography. The fraction containing the targeted product was concentrated under reduced pressure, yielding 13.3 g of a pale yellowish white powder of the targeted product (purity of 95.2%, which was determined by high performance liquid chromatography).

The results of proton nuclear magnetic resonance (NMR) spectral analysis (400 MHz, solvent: DMSO-d6) of the thus obtained reaction product confirmed that the targeted product, i.e., the compound (1), had been obtained. The yield of the thus obtained compound (1) relative to 2,2-bis[4,4-bis{3-bis(2,5-dimethyl-4-hydroxyphenyl)methyl-4-carboxymethoxy-5-methylphenyl}cyclohexyl]propane serving as a source material was 43.6%.

[Chemical Formula 31]

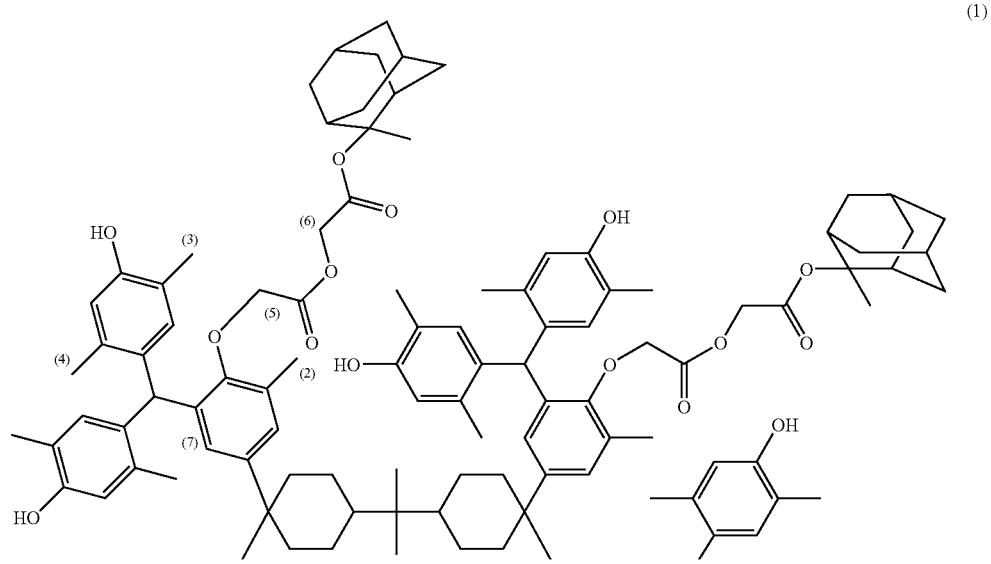

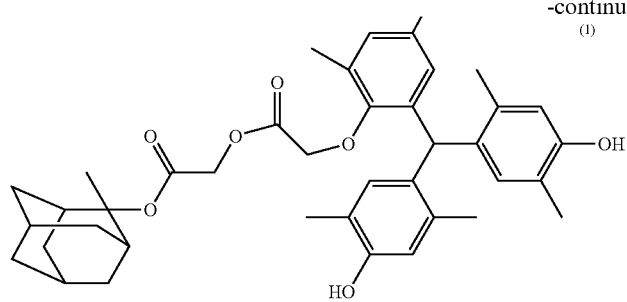
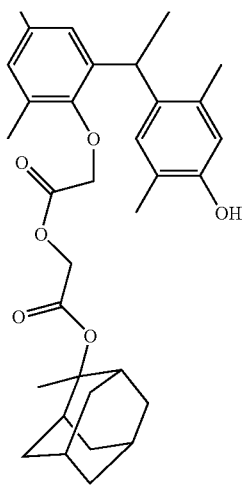

TABLE 4

$^1$H-NMR (400 MHz) identification results
(internal standard: tetramethylsilane)

| Shift value (ppm) | Number of protons | Signal | Assignment |
|---|---|---|---|
| 0.31 | 6 | s | —CH$_3$ (1) |
| 0.59 | 4 | s | —CH$_2$(cyclohexyl) |
| 1.03 | 2 | s | —CH(cyclohexyl) |
| 1.22 | 4 | s | —CH$_2$(cyclohexyl) |
| 1.51-2.22 | 136 | m | —CH$_2$(cyclohexyl) + —CH$_3$ [(2) + (3) + (4)] + ADM |
| 3.97-4.03 | 8 | m | —CH$_2$ (5) |
| 4.62-4.64 | 8 | m | —CH$_2$ (6) |
| 5.72-5.73 | 4 | m | —CH (7) |
| 6.26-6.94 | 24 | m | Ph-H |
| 8.89-8.91 | 8 | m | Ph-OH |

Example 1, Comparative Example 1 and Reference Example 1

The components shown in Table 5 below were mixed together and dissolved to obtain positive resist composition solutions.

TABLE 5

|  | Component (A) | Component (B) | Component (D) | Component (S) |
|---|---|---|---|---|
| Example 1 | (A)-1 [100] | (B)-1 [15] | (D)-1 [1.0] | (S)-1 [2200] |
| Comparative Example 1 | (A')-1 [100] | (B)-1 [15] | (D)-1 [1.0] | (S)-1 [2200] |
| Reference Example 1 | (A')-2 [100] | (B)-1 [15] | (D)-1 [1.0] | (S)-1 [2200] |

The values in brackets [ ] in Table 5 indicate the amount (in terms of parts by weight) of the component added. Further, the reference characters in Table 5 indicate the following.

(A)-1: the compound (1) described above.

(A')-1: the compound synthesized in accordance with the descriptions disclosed in WO 2007/034719 (Synthesis Example 5 in paragraph [0152]) and represented by formula (A')-1 shown below.

(A')-2: the copolymer represented by chemical formula (A')-2 shown below and having a weight average molecular weight (Mw) of 10,000 and dispersity (Mw/number average molecular weight) of 1.7 (in the formula, m:n=70:30 (molar ratio)).

(B)-1: triphenylsulfonium nonafluoro-n-butane sulfonate.

(D)-1: tri-n-octylamine.

(S)-1: a mixed solvent of PGMEA and PGME (PGMEA: PGME=6:4 (weight ratio)).

[Chemical Formula 32]

(A')-1

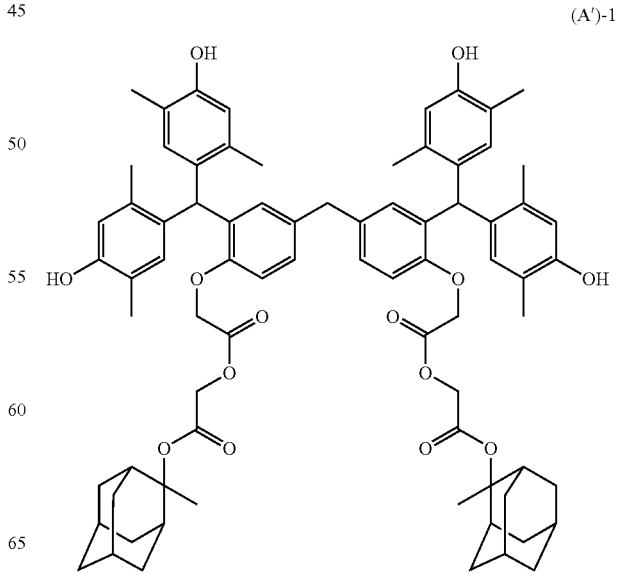

-continued

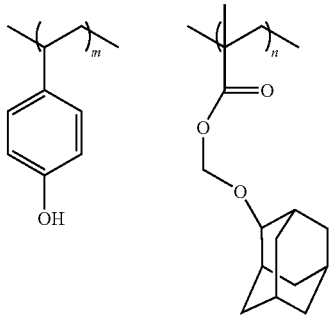
(A')-2

The following evaluations were performed using the positive resist composition solutions thus obtained.

<Heat Resistance>

An organic anti-reflection film composition (product name: DUV-42P, manufactured by Brewer Science Ltd.) was applied onto an 8-inch silicon wafer using a spinner, and the composition was then baked and dried at 180° C. for 60 seconds, thereby forming an organic anti-reflection film having a film thickness of 65 nm.

Then, the positive resist composition obtained above was applied onto the organic anti-reflection film using a spinner, and was then prebaked (PAB) and dried on a hotplate at 100° C. for 60 seconds, thereby forming a resist film having a film thickness of 100 nm. This resist film was then selectively irradiated with a KrF excimer laser (248 nm) through a mask pattern, using a KrF exposure apparatus NSR-S203B (manufactured by Nikon Corporation, NA (numerical aperture)= 0.68, $\sigma$=0.75). Subsequently, a PEB treatment was conducted at 100° C. for 60 seconds, and the resist film was then developed for 30 seconds at 23° C. in a 2.38% by weight aqueous solution of tetramethylammonium hydroxide (TMAH), and then rinsed by washing for 15 seconds with pure water, thus forming a contact hole resist pattern (hereafter, referred to as CH pattern) having a hole diameter of 170 nm.

The thus formed CH pattern was further subjected to a post bake treatment at predetermined temperatures (i.e., [23° C., 105° C., 110° C., 115° C., 120° C. or 125° C.] for Comparative Example 1, and [23° C., 150° C., 155° C., 160° C. and 165° C.] for Example 1 and Reference Example 1) for 60 seconds, and the hole diameter (nm) after each post bake treatment was determined.

From the results obtained above, the post bake temperature at which a resist pattern was caused to flow due to the post bake treatment and thereby reducing the size of the hole diameter by 10% as compared to the hole diameter before the post bake treatment (i.e., 170 nm), was determined and was defined as a thermal flow (TF) temperature. Higher values for this TF temperature indicate a higher heat resistance for the resist composition. The results are shown in Table 6.

As is evident from the results shown in Table 6, the positive resist composition of Example 1 was confirmed to exhibit, as that of Reference Example 1 using a polymer as a base material component, a considerably higher heat resistance than that of Comparative Example 1 using a known low molecular weight compound as a base material component.

TABLE 6

| | TF temperature (° C.) |
|---|---|
| Example 1 | 154.6 |
| Comparative Example 1 | 108.4 |
| Reference Example 1 | 159.4 |

<Resolution>

Each of the positive resist composition solutions obtained in Example 1, Comparative Example 1 and Reference Example 1 was applied uniformly, using a spinner, to the surface of an 8-inch silicon substrate that had been treated with hexamethyldisilazane (HMDS) at 90° C. for 36 seconds, and was then subjected to a bake treatment (PAB) at 110° C. for 60 seconds, thus forming a resist film (film thickness: 80 nm).

This resist film was then subjected to direct patterning (exposure) with an electron beam lithography apparatus HL-800D (VSB) (manufactured by Hitachi, Ltd.) at an accelerating voltage of 70 kV, and was subsequently subjected to a bake treatment (PEB) at 100° C. for 60 seconds, developed for 30 seconds in a 2.38% by weight aqueous tetramethylammonium hydroxide (TMAH) solution (at 23° C.), and then rinsed in pure water for 15 seconds, thus forming a line and space resist pattern (hereafter, referred to as LS pattern).

At this time, the exposure dose Eop ($\mu C/cm^2$) at which a 100 nm LS pattern was formed in a 1:1 ratio was determined. The Eop was 88.0 $\mu C/cm^2$, 24.0 $\mu C/cm^2$, and 32.0 $\mu C/cm^2$ in Example 1, Comparative Example 1, and Reference Example 1, respectively.

The critical resolution (nm) at the above Eop value was determined as "Resolution" using a measuring scanning electron microscope (SEM) S-9220 (manufactured by Hitachi, Ltd.). The results are shown in Table 7.

<Pattern Shape>

The shape of the LS pattern having a line width of 60 nm (a line width of 70 nm in Comparative Example 1 and Reference Example 1) formed with the above-mentioned Eop was observed using a measuring SEM and a cross sectional SEM, and was evaluated based on the following criteria. The results are shown in Table 3.

(Criteria)

A: resist pattern having excellent shape with a cross sectional shape exhibiting a high degree of rectangularity B: resist pattern with a cross sectional shape having a rounded top and exhibiting a low degree of rectangularity

TABLE 7

| | Resolution (nm) | Shape |
|---|---|---|
| Example 1 | 60 | A |
| Comparative Example 1 | 70 | B |
| Reference Example 1 | 70 | B |

The critical resolution for the resist composition of Example 1 was 60 nm and was more favorable than those of Comparative Example 1 and Reference Example 1. Here, when an LS pattern (1:1) with target dimensions of 60 nm was formed using the resist composition of Comparative Example 1, the space portions could not be formed (removed) completely, resulting in the connection of each line portions. Further, when an LS pattern (1:1) with target dimensions of 60 nm was formed using the resist composition of Reference Example 1, a part of line portions were lost.

The above results confirmed favorable lithography properties for the resist pattern formed using the positive resist composition of the present invention.

Examples 2 to 6, Comparative Example 2

The components shown in Table 8 below were mixed together and dissolved to obtain positive resist composition solutions.

TABLE 8

| | Component (A) | Component (B) | | Component (D) | Component (E) | Component (S) |
|---|---|---|---|---|---|---|
| Example 2 | (A)-1 [100] | (B)-2 [29.4] | — | (D)-1 [1.2] | (E)-1 [1.41] | (S)-1 [3200] |
| Example 3 | (A)-1 [100] | (B)-3 [26.8] | — | (D)-1 [1.2] | (E)-1 [1.41] | (S)-1 [3200] |
| Example 4 | (A)-1 [100] | (B)-4 [36.3] | — | (D)-1 [0.6] | (E)-1 [0.71] | (S)-1 [3200] |
| Example 5 | (A')-1 [100] | (B)-6 [14.6] | (B)-7 [12.4] | (D)-1 [0.6] | — | (S)-1 [3200] |
| Example 6 | (A)-1 [100] | (B)-5 [36.3] | — | (D)-1 [0.9] | (E)-1 [1.05] | (S)-1 [3200] |
| Comparative Example 2 | (A')-1 [100] | (B)-6 [14.6] | (B)-7 [12.4] | (D)-1 [1.9] | (E)-1 [0.75] | (S)-1 [3200] |

The values in brackets [ ] in Table 8 indicate the amount (in terms of parts by weight) of the component added. Further, in Table 8, (A)-1, (A')-1, (D)-1 and (S)-1 are as defined and shown above in Table 5, and (B)-2 to (B)-7 and (E)-1 respectively indicate the following components. Of these, the components synthesized in Synthesis Examples described later were used for (B)-2 to (B)-5.

(B)-2: an acid generator represented by chemical formula (B)-2 shown below.

(B)-3: an acid generator represented by chemical formula (B)-3 shown below.

(B)-4: an acid generator represented by chemical formula (B)-4 shown below.

(B)-5: an acid generator represented by chemical formula (B)-5 shown below.

(B)-6: an acid generator represented by chemical formula (B)-6 shown below.

(B)-7: an acid generator represented by chemical formula (B)-7 shown below.

(E)-1: salicylic acid.

[Chemical Formula 33]

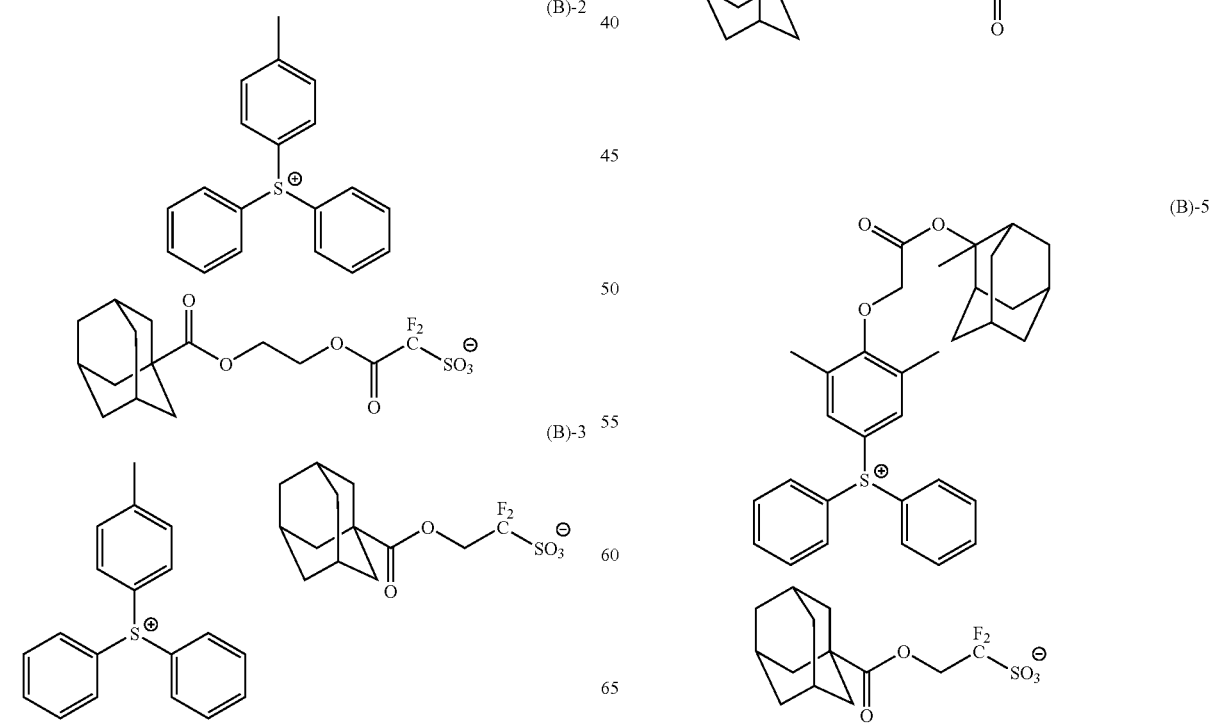

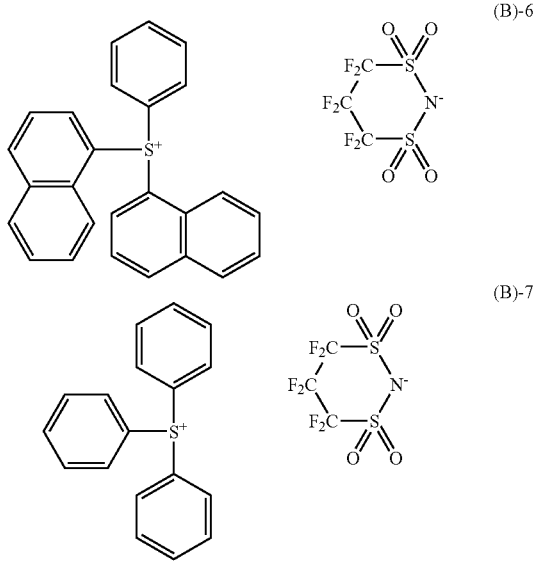

<Resolution>
Each of the positive resist composition solutions obtained in Examples 2 to 6 and Comparative Example 2 was applied uniformly, using a spinner, to the surface of an 8-inch silicon substrate that had been treated with hexamethyldisilazane (HMDS) at 90° C. for 36 seconds, and was then subjected to a bake treatment (PAB) at 120° C. for 60 seconds, thus forming a resist film (film thickness: 60 nm).

This resist film was then subjected to direct patterning (exposure) with an electron beam lithography apparatus HL-800D (VSB) (manufactured by Hitachi, Ltd.) at an accelerating voltage of 70 kV, and was subsequently subjected to a bake treatment (PEB) at 100° C. for 60 seconds, developed for 30 seconds in a 2.38% by weight aqueous tetramethylammonium hydroxide (TMAH) solution (at 23° C.), and then rinsed in pure water for 15 seconds, thus forming a line and space pattern (hereafter, referred to as LS pattern).

At this time, the exposure dose Eop ($\mu C/cm^2$) at which a 100 nm LS pattern was formed in a 1:1 ratio was determined, and the results are shown in Table 9.

Further, the critical resolution (nm) at the above Eop value was determined as "Resolution" using a measuring scanning electron microscope (SEM) S-9220 (manufactured by Hitachi, Ltd.). The results are shown in Table 9.

Furthermore, the shape of the LS pattern having a line width of 60 nm (a line width of 70 nm in Comparative Example 2) formed with the above-mentioned Eop was observed using a measuring SEM and a cross sectional SEM, and was evaluated based on the same criteria as that adopted in Example 1 described above. The results are shown in Table 9.

TABLE 9

| | Eop ($\mu C/cm^2$) | Resolution (nm) | Shape |
|---|---|---|---|
| Example 2 | 32.0 | 60 | A |
| Example 3 | 34.0 | 60 | A |
| Example 4 | 30.0 | 60 | A |
| Example 5 | 36.0 | 60 | A |
| Example 6 | 34.0 | 60 | A |
| Comparative Example 2 | 58.0 | 70 | B |

The above results confirmed favorable lithography properties for the resist pattern formed using the positive resist composition of the present invention.

Synthesis Example of Component (B)

[Synthesis of (B)-3]

35.6 g of 4-methylphenyldiphenylsulfonium bromide was dissolved in 360 g of pure water, and 360 g of dichloromethane and 38.0 g of sodium 2-(1'-adamantane)carbonyloxy-1,1-difluoroethanesulfonate were added to the aqueous solution, and the resulting mixture was stirred at room temperature for 14 hours. Thereafter, the dichloromethane layer was separated, washed with diluted hydrochloric acid and then with water, and was concentrated and evaporated to dryness, thereby yielding 58 g of the targeted compound (B)-3 as a white solid.

[Chemical Formula 34]

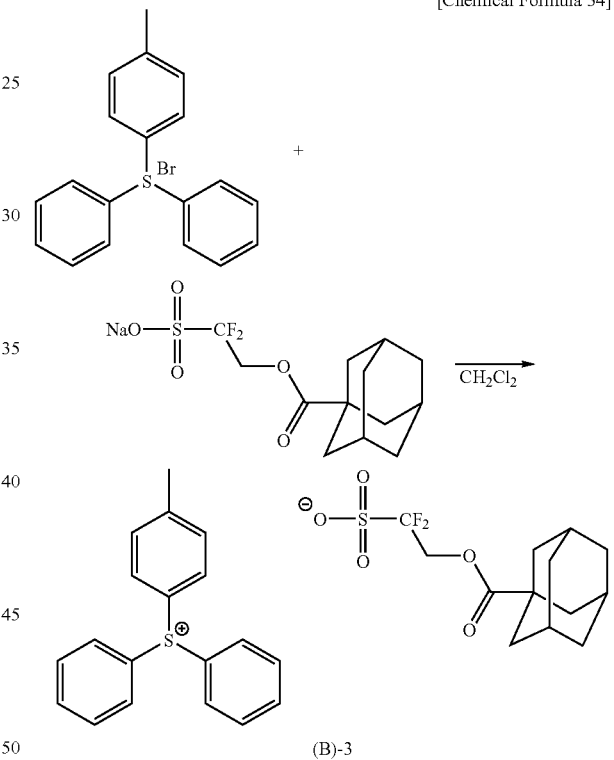

[Synthesis of (B)-5]

5.87 g of 3,5-dimethyl-4-(2-methyl-2-adamantyloxycarbonylmethyleneoxy)phenyldiphenylsulfonium bromide, 41.85 g of dichloromethane, and 20.93 g of pure water were added to a beaker, and 4.16 g of sodium 2-(1'-adamantane)carbonyloxy-1,1-difluoroethanesulfonate was further added thereto, and the resulting mixture was stirred at room temperature for 1 hour. Thereafter, the resulting reaction solution was separated, and the organic phase (organic layer) was washed with diluted hydrochloric acid and then with water. Thereafter, the obtained organic phase was added dropwise to 249.0 g of n-hexane, thereby yielding 6.70 g of the targeted compound (B)-5 as a white powder.

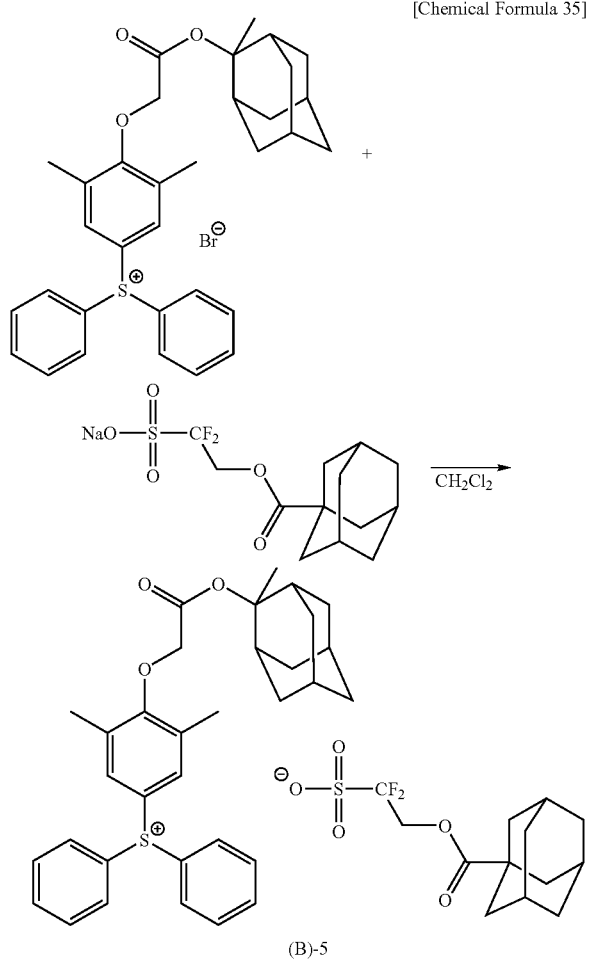

(B)-5

[Synthesis of (B)-2]

(i)

150 g of methyl fluorosulfonyl(difluoro)acetate and 375 g of pure water were kept at 10° C. or lower in an ice bath, and 343.6 g of a 30% aqueous solution of sodium hydroxide was dropwise added thereto. Following dropwise addition, the resultant was refluxed at 100° C. for 3 hours, followed by cooling and neutralizing with concentrated hydrochloric acid. The resulting solution was dropwise added to 8,888 g of acetone, and the precipitate was collected by filtration and dried, thereby obtaining 184.5 g of a compound (I) in the form of a white solid (purity: 88.9%, yield: 95.5%).

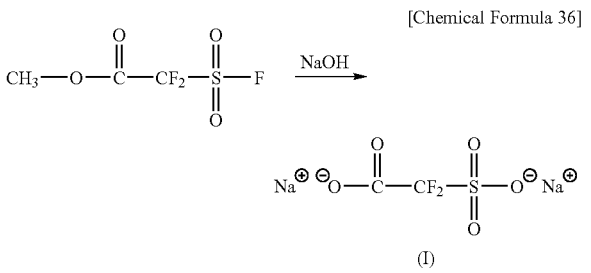

(ii)

56.2 g of the compound (I) and 562.2 g of acetonitrile were prepared, and 77.4 g of p-toluenesulfonic acid monohydrate was added thereto. The resultant was refluxed at 110° C. for 3 hours. Then, the reaction liquid was filtered, and the filtrate was concentrated and dried to obtain a solid. 900 g of t-butyl methyl ether was added to the obtained solid and stirred. Thereafter, the resultant was filtered, and the residue was dried, thereby obtaining 22.2 g of a compound (II) in the form of a white solid (purity: 91.0%, yield: 44.9%).

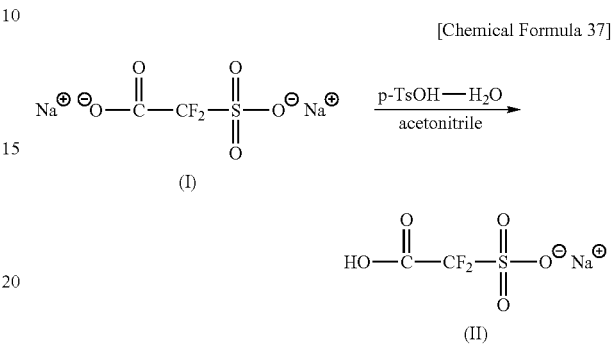

(iii)

4.34 g of the compound (II) (purity: 94.1%), 3.14 g of 2-benzyloxyethanol and 43.4 g of toluene were prepared, and 0.47 g of p-toluenesulfonic acid monohydrate was added thereto. The resultant was refluxed at 105° C. for 20 hours. Then, the reaction liquid was filtered, and 20 g of hexane was added to the residue and stirred. Thereafter, the resultant was filtered, and the residue was dried, thereby obtaining 1.41 g of a compound (III) (yield: 43.1%).

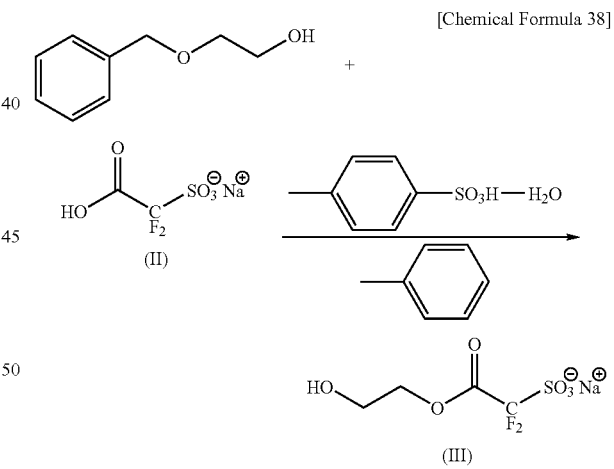

(iv)

1.00 g of the compound (III) and 3.00 g of acetonitrile were prepared, and 0.82 g of 1-adamantanecarbonyl chloride and 0.397 g of triethylamine were dropwise added thereto upon cooling in ice. Following dropwise addition, the resultant was stirred at room temperature for 20 hours and was then filtered. The obtained filtrate was concentrated and dried, dissolved in 30 g of dichloromethane, and washed three times with water. Thereafter, the resulting organic layer was concentrated and dried, thereby obtaining 0.82 g of a compound (IV) (yield: 41%).

[Chemical Formula 39]

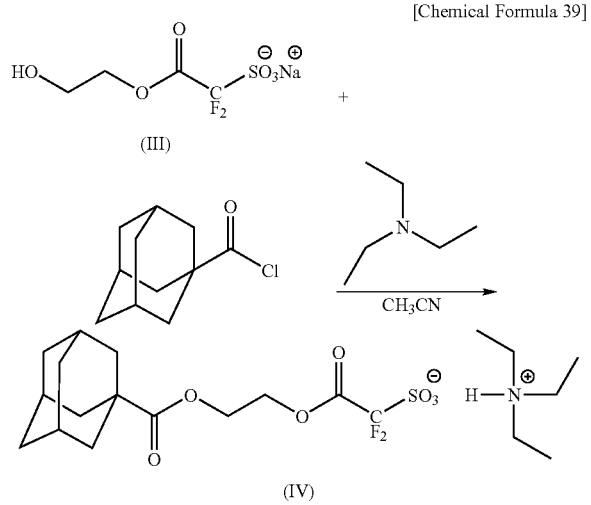

(v)
0.384 g of a compound (V) shown below was dissolved in 3.84 g of dichloromethane and 3.84 g of water, and 0.40 g of the compound (IV) was then added to the resulting solution. The resultant was stirred for 1 hour, and an organic layer was subsequently recovered by the separation treatment and was then washed three times with 3.84 g of water. Thereafter, the resulting organic layer was concentrated and dried, thereby obtaining 0.44 g of a compound (B)-2 (yield: 81.5%).

[Chemical Formula 40]

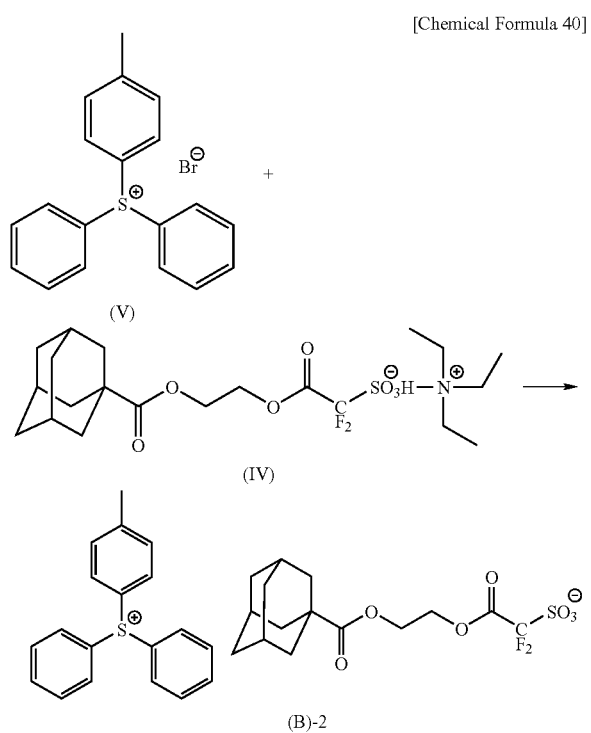

[Synthesis of (B)-4]
(i)
To methanesulfonic acid (60.75 g) controlled to 20° C. or lower was added phosphorus oxide (8.53 g), 2,5-dimethylphenol (8.81 g) and diphenylsulfoxide (12.2 g) in small amounts. The resultant was matured for 30 minutes while maintaining the temperature at 15 to 20° C., followed by elevating the temperature to 40° C. and maturing for 2 hours. Then, the reaction solution was dropwise added to pure water (109.35 g) cooled to 15° C. or lower. Thereafter, dichloromethane (54.68 g) was added thereto and stirred, and the dichloromethane layer was collected. Hexane (386.86 g) at a temperature of 20 to 25° C. was charged into a separate vessel, and the dichloromethane layer was dropwise added thereto. Then, the resultant was matured at 20 to 25° C. for 30 minutes, followed by filtration, thereby obtaining 17.14 g of an objective compound (XIII) (yield: 70.9%).

[Chemical Formula 41]

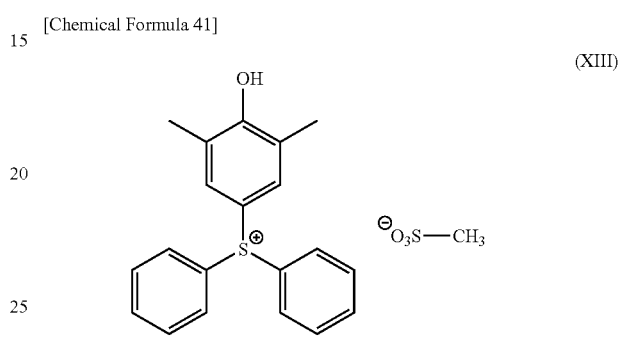

(ii)
Subsequently, 4 g of the obtained compound (XIII) was dissolved in 79.8 g of dichloromethane. After confirming that the compound (XIII) had dissolved in dichloromethane, 6.87 g of potassium carbonate was added thereto, and 3.42 g of bromoacetic acid methyl adamantane (2-methyl-2-adamantyl bromoacetate) was further added. A reaction was effected under reflux for 24 hours, followed by filtration, washing with water, and crystallization with hexane. The resulting powder was dried under reduced pressure, thereby obtaining 3.98 g of an objective compound (XIV) (yield: 66%).

[Chemical Formula 42]

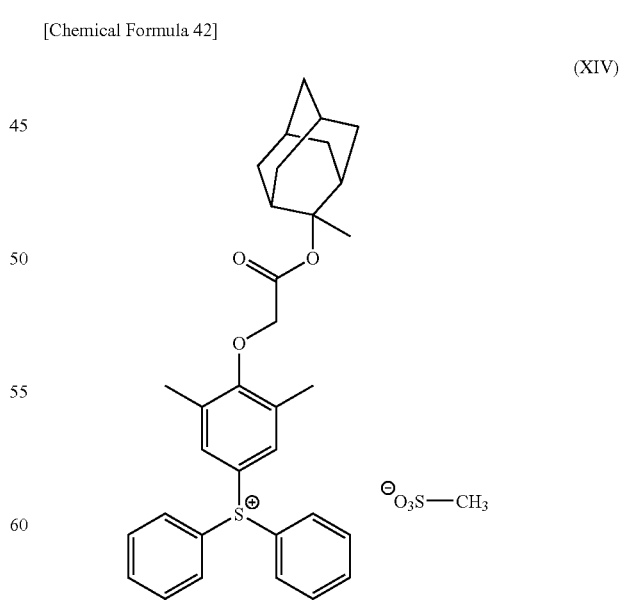

(iii)
4.77 g of the compound (XIV) was dissolved in 23.83 g of dichloromethane and 23.83 g of water, and 3.22 g of the compound (XV) was then added to the resulting solution. The resultant was stirred for 1 hour, and an organic layer was subsequently recovered by the separation treatment and was then washed three times with 3.84 g of water. Thereafter, the resulting organic layer was concentrated and dried, thereby obtaining 4.98 g of a compound (B)-4 (yield: 87%).

[Chemical Formula 43]

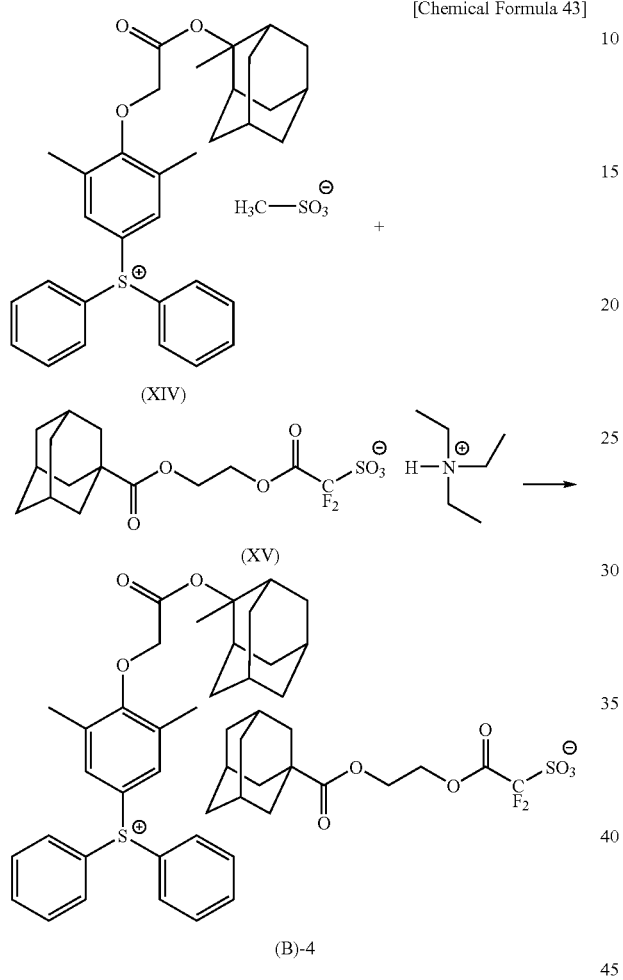

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A positive resist composition comprising:
   a base material component (A) that exhibits increased solubility in an alkali developing solution under action of an acid; and
   an acid generator component (B) that generates an acid upon exposure, wherein
   the base material component (A) comprises a compound (A1) having a structure (I-1):

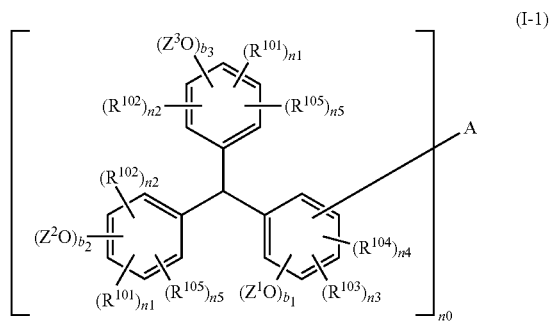

wherein each of $R^{101}$ to $R^{105}$ independently represents an alkyl group of 1 to 10 carbon atoms or an aromatic hydrocarbon group which may include a heteroatom therein; wherein $Z^1$, $Z^2$ and $Z^3$ independently represent an acid-dissociable, dissolution inhibiting group or a hydrogen atom and one or more of $Z^1$, $Z^2$ and $Z^3$ is an acid-dissociable, dissolution inhibiting group; each of $b_1$ $b_2$ and $b_3$ represents an integer of 1 or more, and each of n1 through n5 independently represents an integer of 0 or more, with the proviso that $b_1+n3+n4$, $b_2+n1+n2$ or $b_3+n1+n2$ is not greater than 4; $b_2+n1+n2+n5$ is not greater than 5, $b_3+n1+n2+n5$ is not greater than 5; n0 is 4; and A represents a tetravalent linking moiety.

2. The positive resist composition according to claim 1, wherein the
   acid dissociable, dissolution inhibiting group is represented by the formula (z1) shown below:

wherein $R^{113}$ represents a divalent hydrocarbon group that may have a substituent.

3. The positive resist composition according to claim 1, wherein the tetravalent linking moiety is represented by general formula (a-1) shown below:

[Chemical Formula 3]

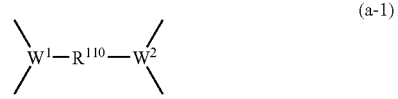

wherein each of $W^1$ and $W^2$ independently represents a cyclic aliphatic hydrocarbon group, and $R^{110}$ represents a linear or branched alkylene group.

4. The positive resist composition according to claim 1, which further comprises a nitrogen-containing organic compound (D).

5. A method of forming a resist pattern, comprising:
   applying a positive resist composition of any one of claims 1, 2, 3 or 4 to a substrate to form a resist film on the substrate;
   exposing the resist film; and
   developing the resist film to form a resist pattern.

* * * * *

UNITED STATES PATENT AND TRADEMARK OFFICE
CERTIFICATE OF CORRECTION

PATENT NO. : 8,278,022 B2
APPLICATION NO. : 12/487083
DATED : October 2, 2012
INVENTOR(S) : Takeyoshi Mimura and Makiko Irie Page 1 of 1

It is certified that error appears in the above-identified patent and that said Letters Patent is hereby corrected as shown below:

At Column 5, Line 60, Change "groups $CH(CH_3)$" to --groups such as $-CH(CH_3)$--.

At Column 21, Line 42, Change "thereof" to --thereof;--.

At Column 40, Line 54, Change "alkylsufonate" to --alkylsulfonate--.

At Column 40, Line 55, Change "alkylsufonate" to --alkylsulfonate--.

At Column 44, Line 54, Change "pattem-wise" to --pattern-wise--.

At Column 48, Line 19, Change "itself" to --itself.--.

At Column 70, Line 22, In Claim 1, change "$b_1$ $b_2$" to --$b_1$, $b_2$--.

At Column 70, Line 31, In Claim 2, after "the" insert --general--.

Signed and Sealed this
Ninth Day of April, 2013

Teresa Stanek Rea
*Acting Director of the United States Patent and Trademark Office*